United States Patent
Mori et al.

(10) Patent No.: US 7,145,825 B2
(45) Date of Patent: Dec. 5, 2006

(54) SEMICONDUCTOR MEMORY DEVICE WITH SHIFT REGISTER-BASED REFRESH ADDRESS GENERATION CIRCUIT

(75) Inventors: Kaoru Mori, Kawasaki (JP); Katuhiro Mori, Kawasaki (JP); Shinichi Yamada, Kawasaki (JP); Kuninori Kawabata, Kawasaki (JP); Shigemasa Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 329 days.

(21) Appl. No.: 10/800,831

(22) Filed: Mar. 16, 2004

(65) Prior Publication Data

US 2004/0184323 A1 Sep. 23, 2004

(30) Foreign Application Priority Data

Mar. 17, 2003 (JP) ............................. 2003-071660

(51) Int. Cl.
*G11C 7/00* (2006.01)
(52) U.S. Cl. .................... 365/222; 365/189.12
(58) Field of Classification Search ............ 365/222, 365/189.12, 240
See application file for complete search history.

(56) References Cited

U.S. PATENT DOCUMENTS 6,925,016 B1 * 8/2005 Takahashi et al. ..... 365/189.07

FOREIGN PATENT DOCUMENTS

EP 0 188 769 A2 7/1986
JP 2000-311487 11/2000

* cited by examiner

*Primary Examiner*—Vu A. Le
(74) *Attorney, Agent, or Firm*—Arent Fox PLLC

(57) ABSTRACT

A semiconductor memory device with low power consumption in driving control signals of shift registers. The device contains a plurality of memory cell arrays each composed of a predetermined number of rows of memory cells. One set of shift registers are coupled to each cell array, and the nth set of shift registers successively activate word line selection signals according to a given control signal, so that the corresponding word lines of the nth cell array will be refreshed. Also coupled to each cell array is a shift register controller. The nth shift register controller provides a control signal to the nth set of shift registers when the nth cell array is being refreshed. When the refresh of that cell array is finished, the nth shift register controller forwards the control signal to the (n+1)th set of shift registers, thus initiating refresh operation for the (n+1)th cell array.

17 Claims, 17 Drawing Sheets

|  | CONDITION | AREA SIZE | INTERVAL |
|---|---|---|---|
| NORMAL | CE2=H | x1 | x1 |
| ENTRY TO PARTIAL REFRESH MODE | CE2=L | x1 | x1 |
| PARTIAL REFRESH | REFLZ=H (1st) | x1/2 | x2 |
| EXIT FROM PARTIAL REFRESH MODE | CE2=H | x1/2 | x1/2 |
| EXIT (continued) | REFLZ=H (1st) | x1 | x1/2 |
| RETURN TO NORMAL | REFLZ=H (2nd) | x1 | x1 |

FIG. 14

| | CONDITION | AREA SIZE | INTERVAL |
|---|---|---|---|
| NORMAL | CE2=H | x1 | x1 |
| ENTRY TO PARTIAL REFRESH MODE | CE2=L | x1 | x1 |
| PARTIAL REFRESH | REFLZ=H (1st) | x1/2 | x2 |
| EXIT FROM PARTIAL REFRESH MODE (RETURN TO NORMAL) | CE2=H | x1 | x1 |

FIG. 17A

| | CONDITION | AREA SIZE | INTERVAL |
|---|---|---|---|
| NORMAL | CE2=H | x1 | x1 |
| ENTRY TO PARTIAL REFRESH MODE | CE2=L | x1/2 | x1 |
| EXIT FROM PARTIAL REFRESH MODE (RETURN TO NORMAL) | CE2=H | x1 | x1 |

FIG. 17B

SEMICONDUCTOR MEMORY DEVICE WITH SHIFT REGISTER-BASED REFRESH ADDRESS GENERATION CIRCUIT

CROSS-REFERENCE TO RELATED APPLICATIONS

This application is based upon and claims the benefits of priority from the prior Japanese Patent Application No.2003-071660, filed on Mar. 17, 2003, the entire contents of which are incorporated herein by reference.

BACKGROUND OF THE INVENTION

1. Field of the Invention

The present invention relates to a semiconductor memory device, and more particularly to a semiconductor memory device with a function of refreshing stored data.

2. Description of the Related Art

A class of semiconductor memory devices such as dynamic random-access memories (DRAMs) store each data bit in the form of a charge on a very small capacitor. Because of the presence of leakage current from capacitors, the stored data cannot be retained indefinitely. The lost capacitor charge must be restored at appropriate intervals by rewriting the same data. This restoration operation is called "refresh."

Existing semiconductor memory devices have an internal address counter to generate refresh address, which is typically a binary counter to produce binary address. This is, however, not always an efficient way. In the case the actual memory size cannot be represented in the form of $2^n$, the address counter would produce useless address values after it has reached the maximum real memory address.

One technique to overcome the above inefficiency in refresh address generation is to use shift registers. Specifically, the semiconductor memory device contains shift registers corresponding to individual word lines of each memory cell array. In refresh cycles, those shift registers successively generate a series of refresh addresses, thus scanning all word lines efficiently. (See, for example, the Japanese Patent Application Publication No.2000-311487, pages 4 and 5, FIGS. 1 to 3.)

We should, however, note that the conventional semiconductor memory devices described above are designed to distribute common control signals to all shift registers when updating refresh address. Since the number of shift registers increases in proportion to memory capacity, the power consumption in driving those control signals would be a problem.

SUMMARY OF THE INVENTION

In view of the foregoing, it is an object of the present invention to provide a semiconductor memory device with low power consumption in driving control signals of shift registers.

To accomplish the above object, the present invention provides a semiconductor memory device with a function of refreshing stored data. This semiconductor memory device comprises the following element: (a) a plurality of cell arrays, each composed of a predetermined number of rows of memory cells; (b) a plurality of sets of shift registers; and (c) a plurality of shift register controllers. The nth set of shift registers successively activate word line selection signals according to a given control signal, so as to refresh corresponding word lines of the nth cell array. The nth shift register controller provides the control signal to the nth set of shift registers when the nth cell array is being refreshed. When the refresh of the nth cell array is finished, the nth shift register controller forwards the control signal to the (n+1)th set of shift registers.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 14 is a table showing the relationship between refresh areas shown in FIG. 13 and refresh intervals.

FIGS. 17A and 17B are tables showing the relationship between the refresh areas shown in FIG. 16 and refresh intervals.

DESCRIPTION OF THE PREFERRED EMBODIMENTS

Figure 1:
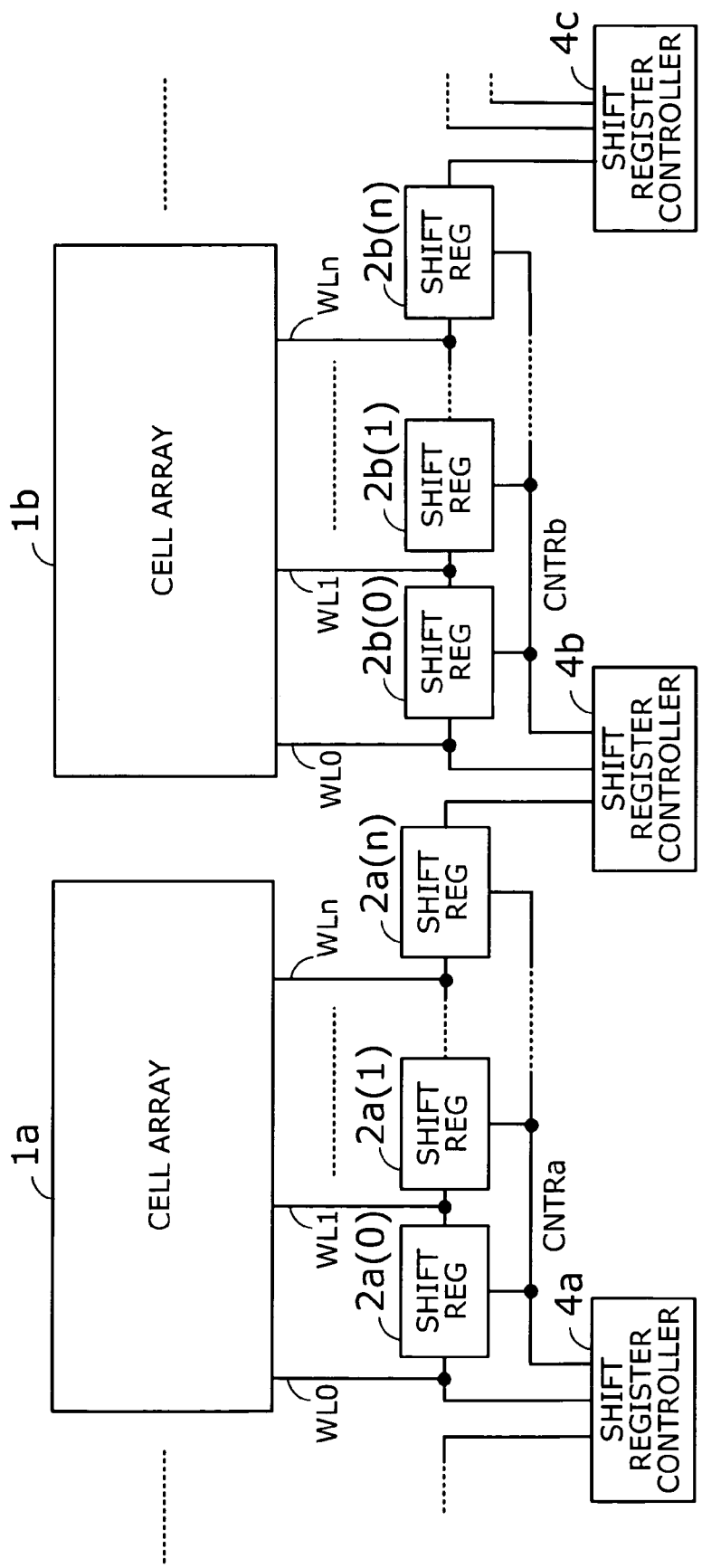
FIG. 1 is a conceptual view of a semiconductor memory device according to the present invention.

Preferred embodiments of the present invention will be described below with reference to the accompanying drawings, wherein like reference numerals refer to like elements throughout.

FIG. 1 shows the concept of a semiconductor memory device according to the present invention, with a focus on the circuit for refreshing memory data. While the device actually has many sets of memory cell arrays, shift registers, and shift register controllers, FIG. 1 only shows a couple of instances for the sake of brevity. They are: cell arrays 1a and 1b, shift registers 2a(0) to 2a(n) and 2b(0) to 2b(n), and shift register controllers 4a, 4b, and 4c.

Note that the reference numerals have different suffixes "a," "b," and "c" to indicate each individual circuit group related to a particular memory cell array. For better readability, we may use the numeral "1" to collectively refer to the cell arrays, where appropriate. Likewise, the shift registers are collectively referred to by the numeral "2," and the shift register controllers are collectively referred to by the numeral "4."

Referring to FIG. 1, the cell arrays 1 are blocks of memory cells arranged in matrix form, each containing a predetermined number of rows. The cell arrays 1 have multiple word lines WL0 to WLn for selection of a particular word in them. Shift registers 2 are attached to those cell arrays 1, one for each word line WL0 to WLn. The shift registers 2 are cascaded; i.e., the output of one register is connected to the input of the next register. In memory refresh cycles, word lines WL0 to WLn are activated one by one to cause data stored in each word to be refreshed. The shift registers 2 receive such a word line selection signal from the previous stage and send it to the next stage, according to control signals CNTRa, CNTRb, and the like, which are given by the corresponding shift register controllers 4.

The shift register controllers 4 serve their corresponding cell arrays 1 by providing control signal (e.g., CNTRa, CNTRb) to their corresponding sets of shift registers 2. When one cell array 1 is all refreshed, its local shift register controller 4 stops sending the control signal and, instead, passes that signal to the succeeding set of shift registers 2, so that the next cell array 1 will be refreshed.

The semiconductor memory device of FIG. 1 operates as follows. Suppose, for example, that the cell array 1a is currently the subject of refresh. To successively activate word lines WL0 to WLn and select a word to be refreshed, the shift registers 2a(0) to 2a(n) forward an active selection signal from stage to stage according to a control signal CNTRa given from the shift register controller 4a. When refresh of this cell array 1a is completed, the shift register controller 4a stops supplying the control signal CNTRa to the shift registers 2a(0) to 2a(n). Then another shift register controller 4b outputs its control signal CNTRb to its local set of shift registers 2b(0) to 2b(n) so that the cell array 1b will be refreshed next. The shift registers 2b(1) to 2b(n) forward an active selection signal from stage to stage according to the control signal CNTRb from the shift register controller 4b, thus successively activating word lines WL0 to WLn of the cell array 1b to select a particular word to be refreshed.

As can be seen from the above, the present invention assigns a shift register controller 4 to each set of shift registers 2 coupled to a cell array 1. The shift registers 2 convey a word line selection signal from stage to stage, according to control signals CNTRa, CNTRb, and the like from the corresponding shift register controller 4, thereby driving word lines WL0 to WLn successively to select each word to be refreshed. The proposed refresh mechanism only requires a single set of shift registers to work simultaneously, during which the other sets of shift registers need no clocks. That is, the present invention limits the number of shift register control signals CNTRa, CNTRb, and the like, which actually consume electric current.

First Embodiment

Figure 2:
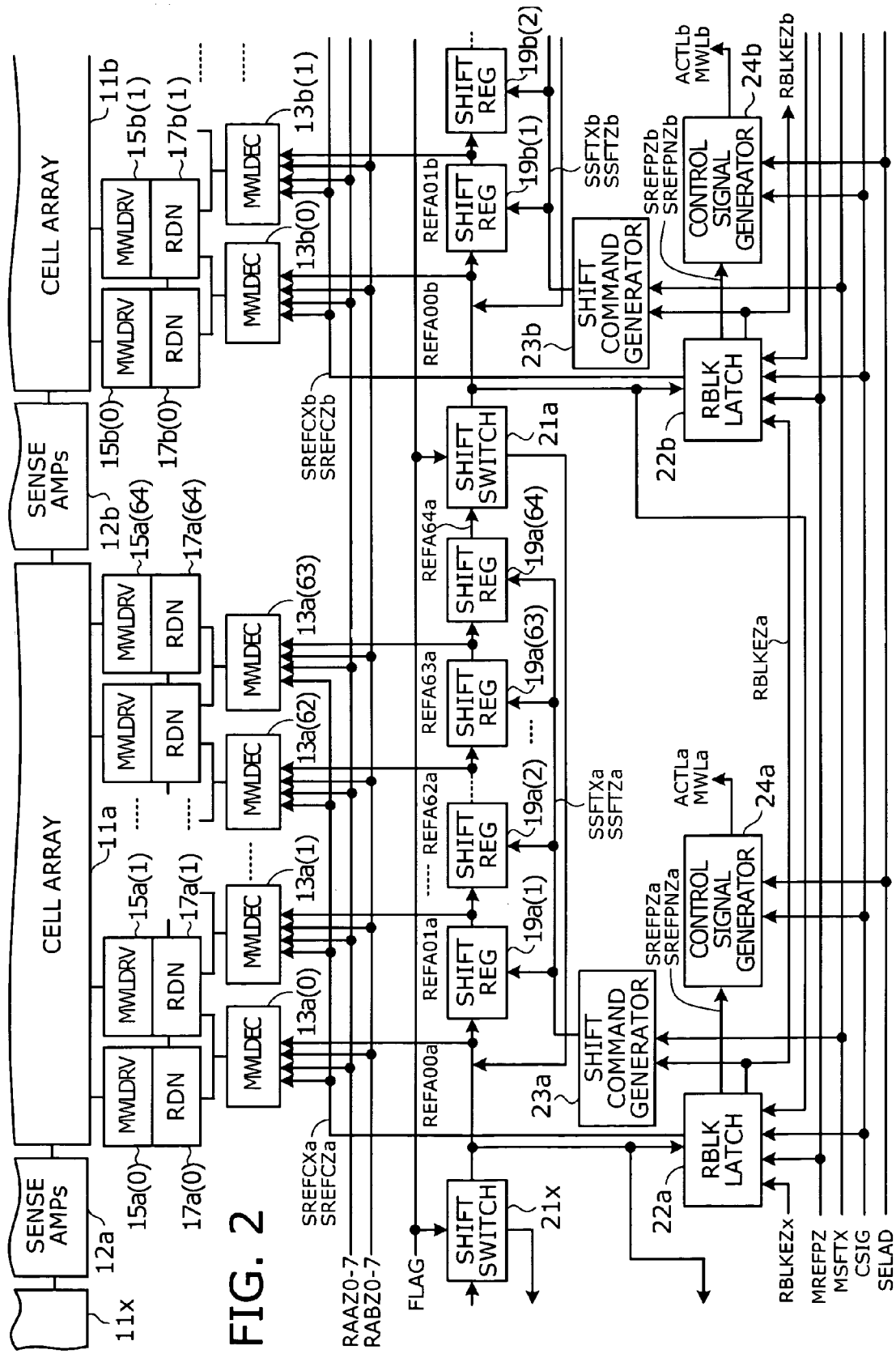
FIG. 2 is a schematic circuit diagram of a semiconductor memory device according to a first embodiment of the invention.

This section describes a first embodiment of the present invention. FIG. 2 is a schematic circuit diagram showing a part of a semiconductor memory device according to a first embodiment of the invention. The illustrated semiconductor memory device comprises the following elements: cell arrays 11x, 11a, 11b, and so on (collectively referred to by the numeral "11"); sense amplifiers 12a, 12b, and so on (collectively "12"); word line decoders (MWLDEC) 13a(0) to 13a(63), 13b(0), 13b(1), and so on (collectively "13"); word line drivers (MWLDRV) 15a(0) to 15a(64), 15b(0), 15b(1), and so on (collectively "15"); redundancy circuits (RDN) 17a(0) to 17a(64), 17b(0), 17b(1), and so on (collectively "17"); shift registers 19a(1) to 19a(64), 19b(1), 19b(2), and so on (collectively "19"); shift switches 21x, 21a, and so on (collectively "21"); row block (RBLK) latches 22a, 22b, and so on (collectively "22"); shift command generators 23a, 23b, and so on (collectively "23"); control signal generators 24a, 24b, and so on (collectively "24").

The cell arrays 11 are blocks of memory cells arranged in matrix form, each containing a predetermined number of rows (word lines). Memory words in each cell array 11 are selected by a combination of main word line address and subordinate word line address. The main word lines of the illustrated cell array 11a are driven by a set of word line drivers 15a(0) to 15a(64), while those of the next cell array 11b are driven by another set of word line drivers 15b(0) to 15b(64) (not all shown).

The sense amplifiers 12 detect and amplify a voltage that appears at each bit line of the corresponding cell arrays 11. Each set of sense amplifiers 12 is shared by two neighboring cell arrays. In the example of FIG. 2, the sense amplifiers 12b are shared by two cell arrays 11a and 11b. Upon request from an external source, the sense amplifiers 12 detect and amplify bit line voltages of the associated cell array 11 that is specified as the subject of a read or write operation. The sense amplifiers 12 also detect and amplify bit line voltages of a cell array 11 that is selected as the subject of refresh operation. Suppose, for example, that the cell array 11a is being refreshed. In this case the corresponding sense amplifiers 12a detect and amplify bit line voltages of the cell array 11a, and so do the subsequent set of sense amplifiers 12b.

Each cell array 11 is assigned a dedicated set of word line decoders 13. In FIG. 2, a first set of word line decoders 13a(0) to 13a(63) serve the cell array 11a, while a second set of word line decoders 13b(0), 13b(1), and the like serve the cell array 11b.

The word line decoders 13a(0) to 13a(63) receive address switching signals SREFCXa and SREFCZa from the RBLK latch 22a and normal address signals RAAZ0 to RAAZ7 and RABZ0 to RABZ7 from other source. The leftmost word line decoder 13a(0) in FIG. 2 further receives a refresh signal REFA00a from the preceding shift switch 21x. The next word line decoder 13a(1) receives a refresh signal REFA01a from the first-stage shift register 19a(1). Other decoders each receive refresh signals in a similar way, and the last word line decoder 13a(63) receives a refresh signal REFA63a from the shift register 19a(63).

Address switching signals SREFCXa, SREFCZa, SREFCXb, and SREFCZb indicate the presence of an internal refresh request or a data read/write request from the external circuit. Normal address signals RAAZ0 to RAAZ7 and RABZ0 to RABZ7 represent a lower and upper address inputs given by external circuitry, respectively. Refresh signals REFA00a to REFA63a are used to drive main word lines of the cell array 11a to refresh the memory cells on those lines. Refresh signals REFA00b, REFA01b, and so on are used to drive main word lines of the cell array 11b to refresh the corresponding cells.

Depending on the state of the address switching signals SREFCXa and SREFCZa, the word line decoders 13a(0) to 13a(63) choose and decode either the normal address signals RAAZ0 to RAAZ7 and RABZ0 to RABZ7 or the refresh signals REFA00a to REFA63a, thus supplying their corresponding redundancy circuit 17a(0) to 17a(64) with signals to drive main word lines of the cell array 11a. Suppose, for example, that the address switching signal SREFCXa and its complementary counterpart SREFCZa indicate the presence of a refresh request (i.e., SREFCXa is low, while SREFCZa is high). In this case, the word line decoders 13a(0) to 13a(63) provide their associated redundancy circuits 17a(0) to 17a(64) with a signal for driving one main word line as specified by the refresh signals REFA00a to REFA63a. When, in turn, the address switching signals SREFCXa and SREFCZa indicate the presence of a data read/write request (i.e., SREFCXa is high, while SREFCZa is low), the word line decoders 13a(0) to 13a(63) decode the given normal address signals RAAZ0 to RAAZ7 and RABZ0 to RABZ7, thus supplying main word line driving signals to their associated redundancy circuits 17a(0) to 17a(64).

The next set of word line decoders 13b(0) to 13b(63) (not all shown) operate similarly to the word line decoders 13a(0) to 13a(63) described above. That is, they either decode normal address signals RAAZ0 to RAAZ7 and RABZ0 to RABZ7 or activate themselves according to given refresh signals REFA00b, REFA01b, and so on, depending on the state of address switching signals SREFCXb and SREFCZb provided from the RBLK latch 22b. Their outputs are supplied to the redundant circuits 17b(0) to 17b(65) to drive main word lines of the cell array 11b.

Word Line Decoder and Word Line Driver

Figure 3:
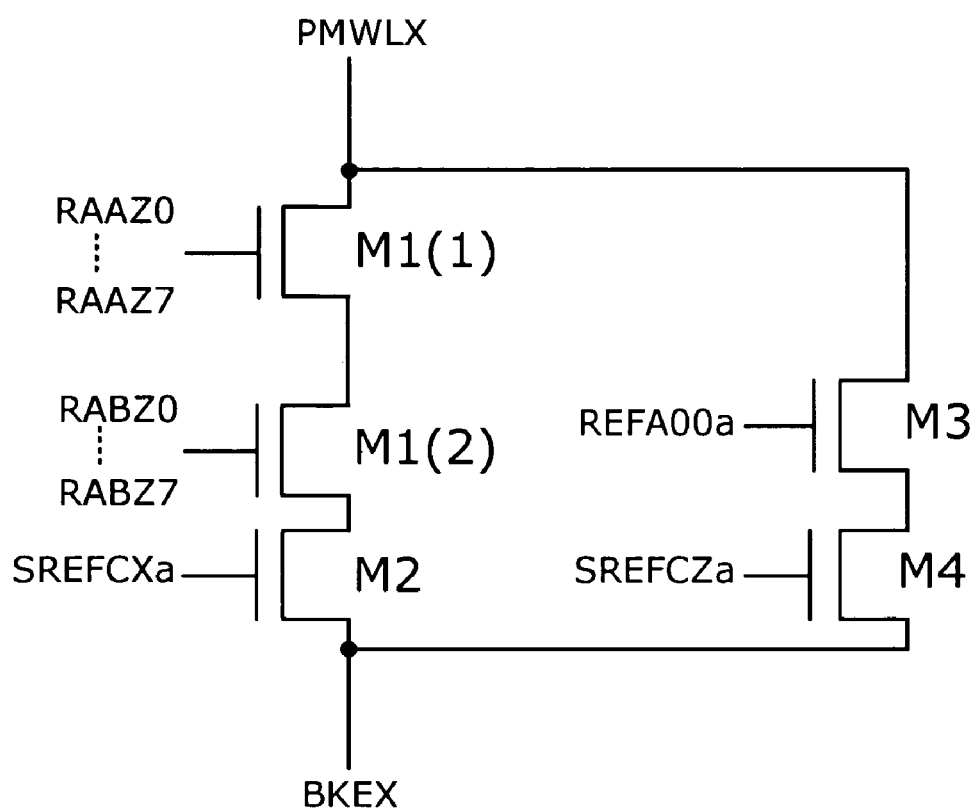
FIG. 3 is a schematic circuit diagram of a word line decoder.

FIG. 3 is a schematic circuit diagram showing an example of word line decoder structure. The illustrated word line decoder 13a(0) is composed of transistors M1(1) and M1(2), M2, M3, and M4. All transistors are n-channel MOSFETs.

Three transistors M1(1), M1(2), and M2 are connected in series, and the drain of the topmost transistor M1(1) is wired to the redundancy circuits 17a(0) and 17a(1) through the line named "PMWLX." Given to the gate of transistor M1(1) is one of the lower normal address signals RAAZ0 to RAAZ7. Likewise, the gate of transistor M1(2) is driven with one of the upper normal address signals RABZ0 to RABZ7. Only a particular combination of upper and lower address signals will turn on the transistors M1(1) and M1(2) simultaneously, thus closing the series circuit.

The gate of the transistor M2 is driven by an address switching signal SREFCXa. Connected to its source terminal is BKEX, a voltage supplied when either the normal address signals RAAZ0 to RAAZ7 and RABZ0 to RABZ7 or the refresh signal REFA00a is valid. When the address switching signal SREFCXa goes high (i.e., when there is a data read/write request), the transistor M2 turns on its source-drain channel. The transistor M4 turns off at this moment, since another address switching signal SREFCZa (which is complementary to SREFCXa) becomes low.

In operation, the transistors M1(1) and M1(2) and M2 will all turn on when the address switching signal SREFCXa is in a high state to indicate the presence of a data read/write request, and only when the normal address signals RAAZ0 to RAAZ7 and RABZ0 to RABZ7 match with a predefined pattern. This condition results in a voltage BKEX appearing at the drain of transistor M1(1). BKEX is the delivered to the redundancy circuits 17a(0) and 17a(1) for use as a word-line driving signal PMWLX, which selects a particular word in the cell array 11a.

Referring now to the right half of FIG. 3, the source terminal of transistor M3 is connected to the drain of transistor M4, and the gate of same is driven by a refresh signal REFA00a. The drain of transistor M3 is connected together with the drain of transistor M1(1). Transistor M4, on the other hand, receives an address switching signal SREFCZa at its gate terminal. Connected to its source terminal is BKEX, a voltage that becomes available when refresh signal REFA00a is valid.

In operation, the two transistors M3 and M4 will turn on when the address switching signal SREFCXa is in a high state to indicate the presence of a refresh request, and only when the refresh signal REFA00a is active. This causes the voltage BKEX to appear at the drain of transistor M3, which is then supplied to the redundancy circuits 17a(0) and 17a(1) for use as a word-line driving signal PMWLX.

The other word line decoders 13a(1) to 13a(63) shown in FIG. 2 are configured in the same way as the word line decoder 13a(0) described above, except that their transistors M1(1) and M1(2) are activated by different combinations of normal address signals, and that their respective transistors M3 are controlled by different refresh signals REFA01a, REFA02a, ... REFA63a. That is, only one of the word line decoders 13a(0) to 13a(63) is allowed to activate a main word line with its word-line driving signal PMWLX, when a particular pattern of normal address signals RAAZ0 to RAAZ7 and RABZ0 to RABZ7 are given. The same is applied to other word line decoders 13b(0), 13b(1), and the like, for which we will omit the explanation.

Referring back to FIG. 2, the memory device has a dedicated set of word line drivers 15 for each cell array 11. Specifically, one set of word line drivers 15a(0) to 15a(64) are attached to the cell array 11a, and another set of word line drivers 15b(0) to 15b(64) (not all shown) are attached to the subsequent cell array 11b. The word line drivers 15a(0) to 15a(64) receive the output signals of the word line decoders 13a(0) to 13a(63) via the corresponding redundancy circuits 17a(0) to 17a(64), and use them to drive main word lines of the cell array 11a. Similarly, the word line drivers 15b(0) to 15b(64) receive the output signals of word line decoders 13b(0) to 13b(63) (not all shown) via the corresponding redundancy circuits 17b(0) to 17b(64) (not all shown). Those signals are used to drive the main word lines of the cell array 11b.

The purpose of the intervening redundancy circuits 17 is to repair a defect found in the memory cells. The output of each word line decoder 13 is connected to two redundancy circuits 17. If a defective memory cell is found on a certain main word line, the relevant redundancy circuits 17 configure themselves to route the word line driving signal from the corresponding word line decoder 13 to a different word line driver 15. Suppose, for example, that the cell array 11a has a defective cell on the first main word line that the word line driver 15a(0) drives. The redundancy circuit 17a(0) disables its associated word line driver 15a(0) while causing the next redundant circuit 17a(1) to supply the word line driver 15a(1) with a main word line driving signal from the word line decoder 13a(0).

Shift Register

Each cell array 11 is given a set of shift registers 19. Specifically, shift registers 19a(1) to 19a(64) serve the cell array 11a, and another set of shift registers 19b(1) to 19b(64) (not all shown) serve the next cell array 11b. The former set of shift registers 19a(1) to 19a(64) are each allocated to a particular main word line of the cell array 11a. Likewise, the latter set of shift registers 19b(1) to 19b(64) are each allocated to a particular main word line of the cell array 11b.

The shift registers 19a(1) to 19a(64) operate under the control of their local shift command generator 23a. In synchronization with subordinate shift command signals SSFTXa and SSFTZa given from the shift command generator 23a, the shift registers 19a(1) to 19a(64) successively produce refresh signals REFA01a to REFA64a. The seed of those signals is a refresh signal REFA00a sent from the preceding shift switch 21x. Note that the refresh signals REFA01a to REFA64a become active only one at a time.

The next set of shift registers 19b(1) to 19b(64) (not all shown) operate in a similar way to the shift registers 19a(1) to 19a(64) described above. That is, they successively produce refresh signals REFA01b to REFA64b (not all shown) in synchronization with subordinate shift command signals SSFTXb and SSFTZb supplied from their local shift command generator 23b, with a seed refresh signal REFA00b received from the preceding shift switch 21a.

Figure 4:
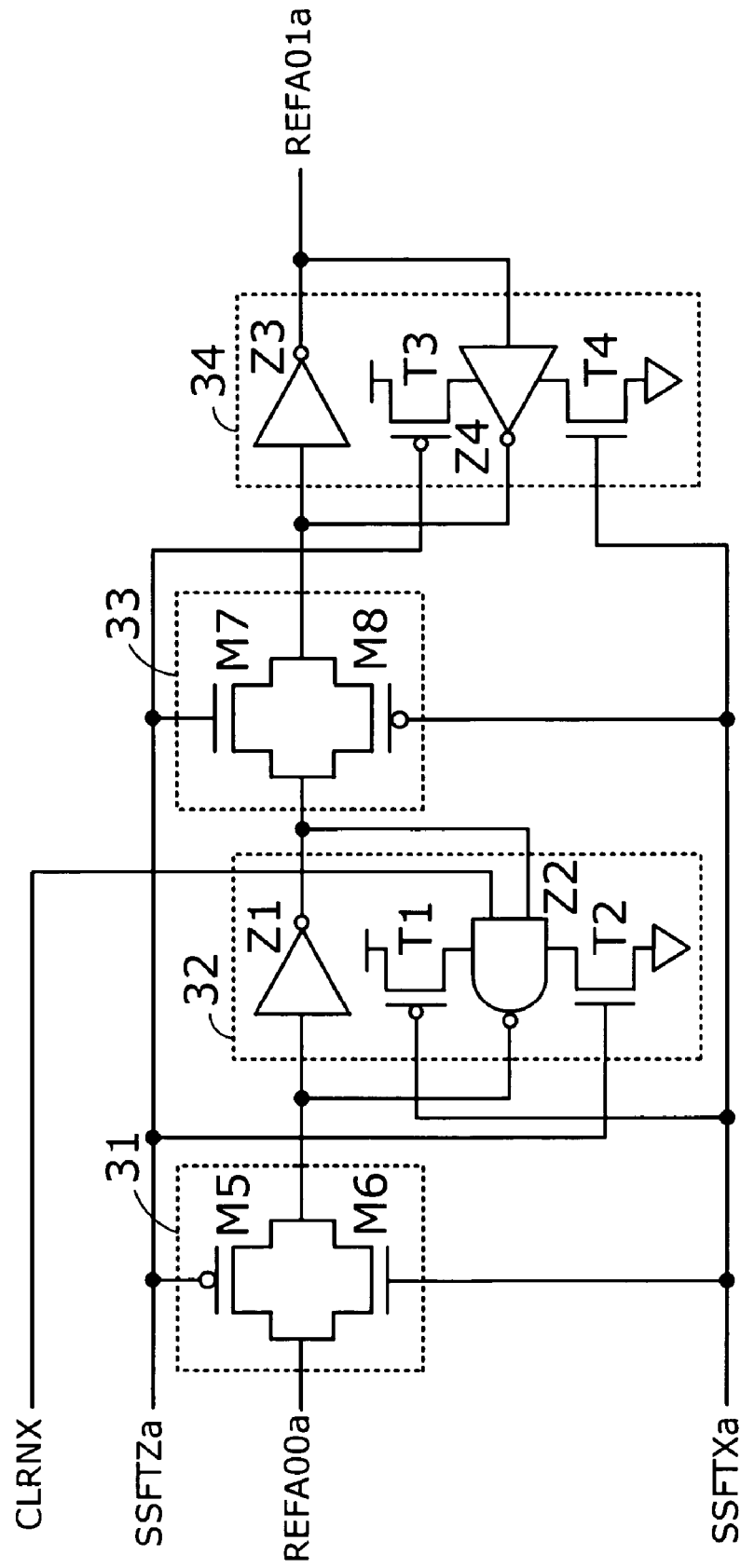
FIG. 4 is a schematic circuit diagram of a shift register.

FIG. 4 is a schematic circuit diagram showing an example of shift register structure. The illustrated shift register 19a(1) is composed of two transfer gates 31 and 33 and two latch circuits 32 and 34. Although the circuit of FIG. 4 is designed to initialize its refresh signal output REFA01a to high level, a small modification to the first latch circuit 32 could change the initial state of REFA01a to low level, without affecting the structure of the other part.

The first transfer gate 31 is composed of two transistors M5 and M6, the former being a p-channel MOSFET, and the latter being an n-channel MOSFET. A subordinate shift command signal SSFTZa is applied to the gate of one transistor M5, while its complementary counterpart SSFTXa is given to the gate of the other transistor M6. This transfer gate 31 transfers a given refresh signal REFA00a from the preceding shift switch 21x to the latch circuit 32 in response to the subordinate shift command signals SSFTXa and SSFTZa.

The first latch circuit 32 is composed of an inverter Z1, a NAND gate Z2, and two transistors T1 and T2. Given to one input of the NAND gate Z2 is an initialization signal CLRNX, which is one of the miscellaneous control signals CSIG shown in FIG. 2. This latch circuit 32 captures and holds the refresh signal REFA00a from the transfer gate 31, making it available to the subsequent transfer gate 33. If an initialization signal CLRNX is given to the NAND gate Z2, the latch circuit 32 clears the latched state of REFA00a, thus sending a low level signal to the transfer gate 33. Transistors T1 (p-channel MOSFET) and T2 (n-channel MOSFET) are attached to the NAND gate Z2. Both transistors T1 and T2 turn off when the transfer gate 31 is active, thus disabling the NAND gate Z2 from driving its load. This additional circuit ensures reliable signal transfer operation from the transfer gate 31 to the latch circuit 32.

The second transfer gate 33 is composed of two transistors M7 and M8, the former being an n-channel MOSFET, and the latter being a p-channel MOSFET. The subordinate shift command signal SSFTZa is given to the gate of one transistor M7, while its complementary counterpart SSFTXa is given to the gate of the other transistor M8. This transfer gate 33 supplies the second latch circuit 34 with the refresh signal held in the first latch circuit 32, in response to the subordinate shift command signals SSFTXa and SSFTZa. The two transfer gates 31 and 33 are always in opposite states; when one turns on, the other turns off, and vice versa.

The second latch circuit 34 is formed from two inverters Z3 and Z4 and two transistors T3 and T4. This latch circuit 34 captures and holds the refresh signal REFA00a from the transfer gate 33, and supplies it to the subsequent shift register 19a(1) as a refresh signal REFA01a. Optionally, the second latch circuit 34 may have the same structure as the first latch circuit 32. Transistors T3 (p-channel MOSFET) and T4 (n-channel MOSFET) are attached to the inverter Z4 in the latch circuit 34. Both transistors T3 and T4 turn off when the transfer gate 33 is active, thus disabling the inverter Z4 from driving its load. This additional circuit ensures reliable signal transfer operation from the transfer gate 33 to the latch circuit 34.

Subordinate shift command signals SSFTXa and SSFTZa are a complementary pair of clock signals alternating between high and low states. In the first half cycle of SSFTXa and SSFTZa, a given refresh signal REFA00a is transferred from the preceding shift switch 21x to the first latch circuit 32 through the first transfer gate 31 that is turned on. In the second half cycle of SSFTXa and SSFTZa, the first transfer gate 31 is closed, whereas the second transfer gate 33 is opened. Accordingly, the refresh signal REFA00a held at the first latch circuit 32 is passed to the second latch circuit 34, which is then supplied to the subsequent shift register as a refresh signal REFA01a.

While we have concentrated on the first shift register 19a(1), the same principle is applied to all the other shift registers 19a(2), 19a(3), and so on. We will therefore omit the explanation of those registers here.

Shift Switch

Referring back to FIG. 2, the shift flag signal FLAG indicates whether the refresh of subordinate word lines has finished in each cell array 11. Think of a hierarchical word line structure where each main word line of the cell array 11a corresponds to, for example, two subordinate word lines. And suppose that the current refresh process has only finished with the first subordinate word lines. At this point, the shift flag signal FLAG indicates the fact that the refresh operation is not yet completed, since the second subordinate word lines are not done. The shift flag signal FLAG will indicate completion when the second subordinate word lines of the cell array 11a are refreshed.

The memory device of FIG. 2 has one shift switch 21 for each cell array 11. Specifically, a shift switch 21x serves the cell array 11x, and another shift switch 21a serves the cell array 11a. Those shift switches 21 are each attached to the last-stage shift register of their respective local cell arrays 11.

The shift switch 21a receives a refresh signal REFA64a from the last-stage shift register 19a(64), as well as the shift flag signal FLAG. If the shift flag signal FLAG at this point indicates that the cell array 11a has not been entirely refreshed, the shift switch 21a feeds the received refresh signal REFA64a back to the first-stage shift register 19a(1) as a new active refresh signal REFA00a. With this refresh signal REFA00a, the shift registers 19a(1) to 19a(63) activates their respective refresh signals REFA01a to REFA63a one by one, according to given subordinate shift command signals SSFTXa and SSFTZa.

In the case the shift flag signal FLAG indicates the completion of all refresh cycles for the cell array 11a, the control should now be passed to the subsequent circuit block serving the cell array 11b that will be refreshed next. Thus the shift switch 21a outputs a refresh signal to the next first-stage shift register 19b(1) and the RBLK latch 22b. The shift switch 21a also sends the same signal to its local RBLK latch 22a, which has controlled the shift registers 19a(1) to 19a(64) so far.

Similar to the shift switch 21a described above, the shift switch 21x receives a refresh signal from the preceding last-stage shift register (not shown) and feeds it back to the first-stage shift register (also not shown) of that group, if so specified by the state of the shift flag signal FLAG. Or, depending on the shift flag signal FLAG, the shift switch 21x sends a refresh signal to the RBLK latch 22a and shift register 19a(1) that will control the cell array 11a in the subsequent refresh cycles, as well as to the RBLK latch that has controlled the present group of shift registers.

The functions of shift switches 21 can thus be summarized as follows: Each shift switch 21 causes its local shift registers to repeat scanning the corresponding cell array 11, until all subordinate word lines of that array 11 are refreshed. When the subordinate word lines are all refreshed, the shift switch 21 sends a refresh signal to shift registers of the succeeding cell array 11 that is to be refreshed next, as well as to the local and succeeding RBLK latches 22.

Figure 5:
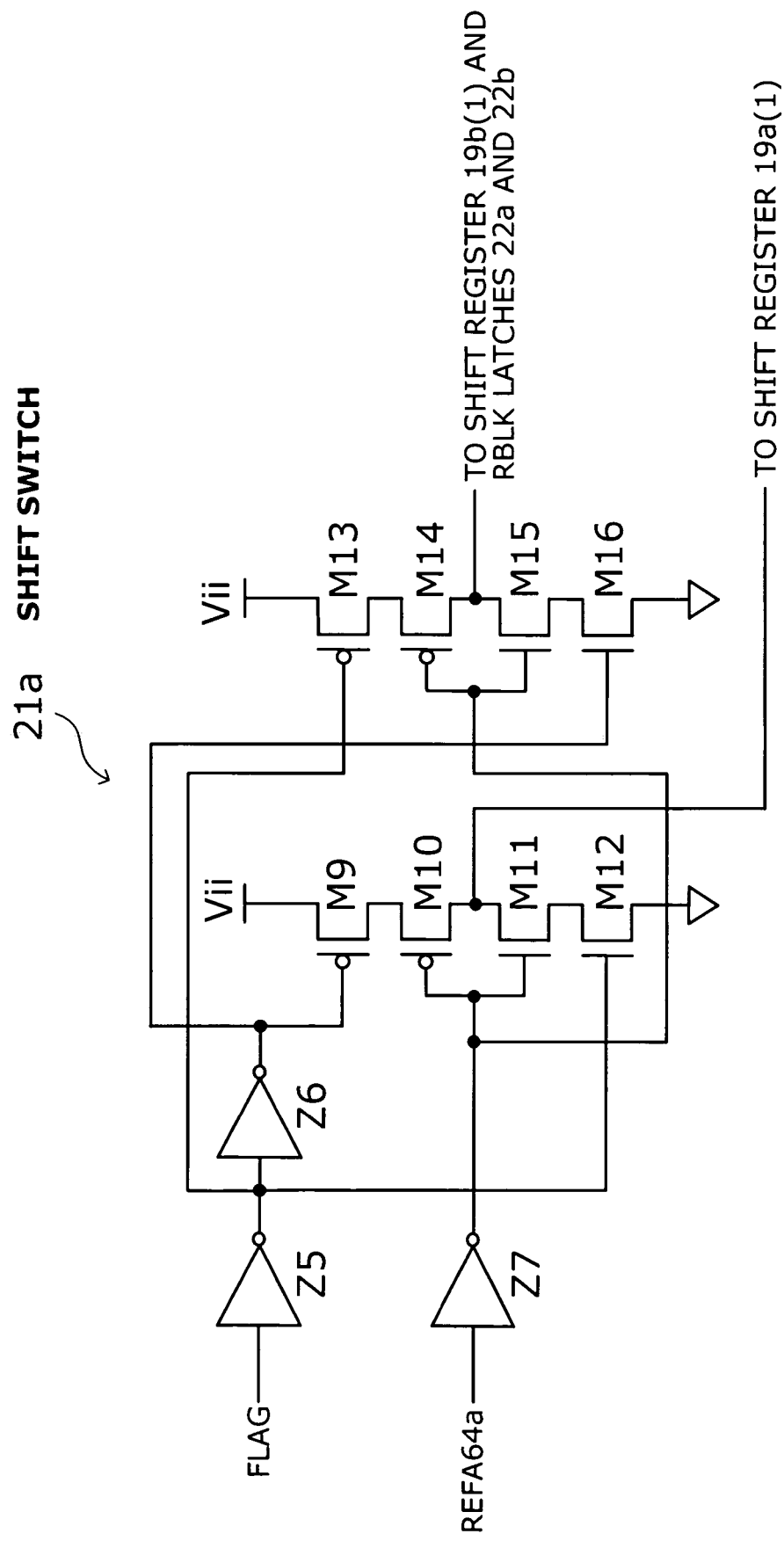
FIG. 5 is a schematic circuit diagram of a shift switch.

FIG. 5 is a schematic circuit diagram showing an example of shift switch structure. The illustrated shift switch 21a is composed of eight transistors M9 to M16 and three inverters Z5 to Z7. Referring first to the middle part of FIG. 5, transistors M9 and M10 are p-channel MOSFETs, whereas transistors M11 and M12 are n-channel MOSFETs. The source of M9 is connected to the supply voltage Vii, and the drain of M9 is connected to the source of M10. The drain of M10 is connected to the drain of M11. The source of M11 is connected to the drain of M12. The source of M12 is connected to the low side of supply voltage.

The middle two transistors M10 and M11 form an inverter circuit, and their gate inputs are driven by an inverter Z7, which offers an inverted version of the refresh signal REFA64a received from the last-stage shift register 19a(64). Shift flag signal FLAG is given to the gate of M9 through two inverters Z5 and Z6, and also to the gate of M12 through the inverter Z5. The drains of M10 and M11 are wired together to the first-stage shift register 19a(1) of the cell array 11a.

In operation, the shift flag signal FLAG turns on and off the upper and lower transistors M9 and M12, and depending on the state of M9 and M12, the middle two transistors M10 and M11 transfer the given refresh signal REFA64a to the first-stage shift register 19a(1) of the cell array 11a that is currently refreshed. More specifically, the shift flag signal FLAG is low during the refresh. This low state of FLAG turns on the upper and lower transistors M9 and M12, thus enabling the middle two transistors M10 and M11 to reverse the inverted refresh signal REFA64a and deliver it to the first-stage shift register 19a(1) of the currently refreshed cell array 11a.

Referring to the right part of FIG. 5, transistors M13 and M14 are p-channel MOSFETs, whereas transistors M15 and M16 are n-channel MOSFETs. The source of M13 is connected to the supply voltage Vii, and the drain of M13 is connected to the source of M14. The drain of M14 is connected to the drain of M15. The source of M15 is connected to the drain of M16. The source of M16 is connected to the low side of supply voltage.

The middle two transistors M14 and M15 form an inverter circuit. Their gate inputs are driven by the inverter Z7, which offers an inverted version of the refresh signal REFA64a received from the last-stage shift register 19a(64). Shift flag signal FLAG is given to the gate of M13 through the inverter Z5, as well as to the gate of M16 through the inverters Z5 and Z6. The drains of M14 and M15 are wired to the RBLK latch 22a of the corresponding cell array 11a, as well as to the RBLK latch 22b and shift register 19b(1) of the subsequent cell array 11b.

In operation, the shift flag signal FLAG turns on and off the upper and lower transistors M13 and M16, and depending on that state of M13 and M16, the middle two transistors M14 and M15 transfer the given refresh signal REFA64a to the RBLK latch 22a of the cell array 11a that is about to finish, as well as to the first-stage shift register 19b(1) and RBLK latch 22b of the cell array 11b that is to be refreshed next. More specifically, the shift flag signal FLAG becomes high to indicate that the refresh has finished. This high state of FLAG turns on the upper and lower transistors M13 and M16, thus enabling the middle two transistors M14 and M15 to reverse the inverted refresh signal REFA64a and deliver it to the RBLK latch 22a of the now-refreshed cell array 11a, as well as to the first-stage shift register 19b(1) and RBLK latch 22b of the cell array 11b, which is the next to be refreshed.

The other shift switch 21x shown in FIG. 2 has the same circuit structure as the shift switch 21a described above. Accordingly, we will omit the explanation of its function here.

RBLK Latch

Referring again to FIG. 2, the illustrated memory device has an RBLK latch 22 for each cell array 11 to control the corresponding set of shift registers 19. Specifically, one RBLK latch 22a controls shift registers 19a(1) to 19a(64) of the cell array 11a, while another RBLK latch 22b controls shift registers 19b(1) to 19b(64) (not all shown) of the cell array 11b.

Upon receipt of a refresh signal from the shift switch 21x of the preceding cell array that is about to finish the refresh operation, the RBLK latch 22a interprets it as a trigger to refresh its local cell array 11a. The RBLK latch 22a thus sends out address switching signals SREFCXa and SREFCZa that request the local word line decoders 13a to 13n to choose refresh address bits. The RBLK latch 22a also asserts a row block selection signal RBLKEZb, thus notifying its local shift command generator 23a that the cell array 11a is selected as the subject of refresh operation. Further, the RBLK latch 22a provides its local control signal generator 24a with subordinate refresh pulses SREFPZa and SREFPNZa.

When the refresh of the cell array 11a is finished, the RBLK latch 22a is so notified by the shift switch 21a through its refresh signal output REFA00b. The RBLK latch 22a then negates the row block selection signal RBLKEZb, thereby stopping the shift registers 19a(1) to 19a(64).

Also, during the time when the preceding cell array 11x is being refreshed, the RBLK latch 22a receives a row block selection signal RBLKEZx from the preceding RBLK latch (not shown). This signal RBLKEZx causes the RBLK latch 22a to send subordinate refresh pulses SREFPNZa to its local control signal generator 24a. As mentioned earlier, sense amplifiers are each shared by two neighboring cell arrays. Subordinate refresh pulses SREFPNZa are necessary in this situation in order to enable the sense amplifiers 12a.

The functions of RBLK latches 22 can thus be summarized as follows: First, upon receipt of a refresh signal from the shift switch 21 of the preceding cell array that is about to exit from the current refresh process, the RBLK latch 22 interprets it as a trigger to refresh its local cell array 11 and starts to control relevant circuits accordingly. Second, upon receipt of a refresh signal from the local shift switch 21 serving the corresponding cell array 11, the RBLK latch 22 recognizes it as a completion notification of refresh, and it thus stops further control operation. Third, upon receipt of a row block selection signal RBLKEZ from the preceding RBLK latch serving the cell array 11 that is about to start refreshing, the RBLK latch 22 activates its local sense amplifiers 12.

Figure 6:
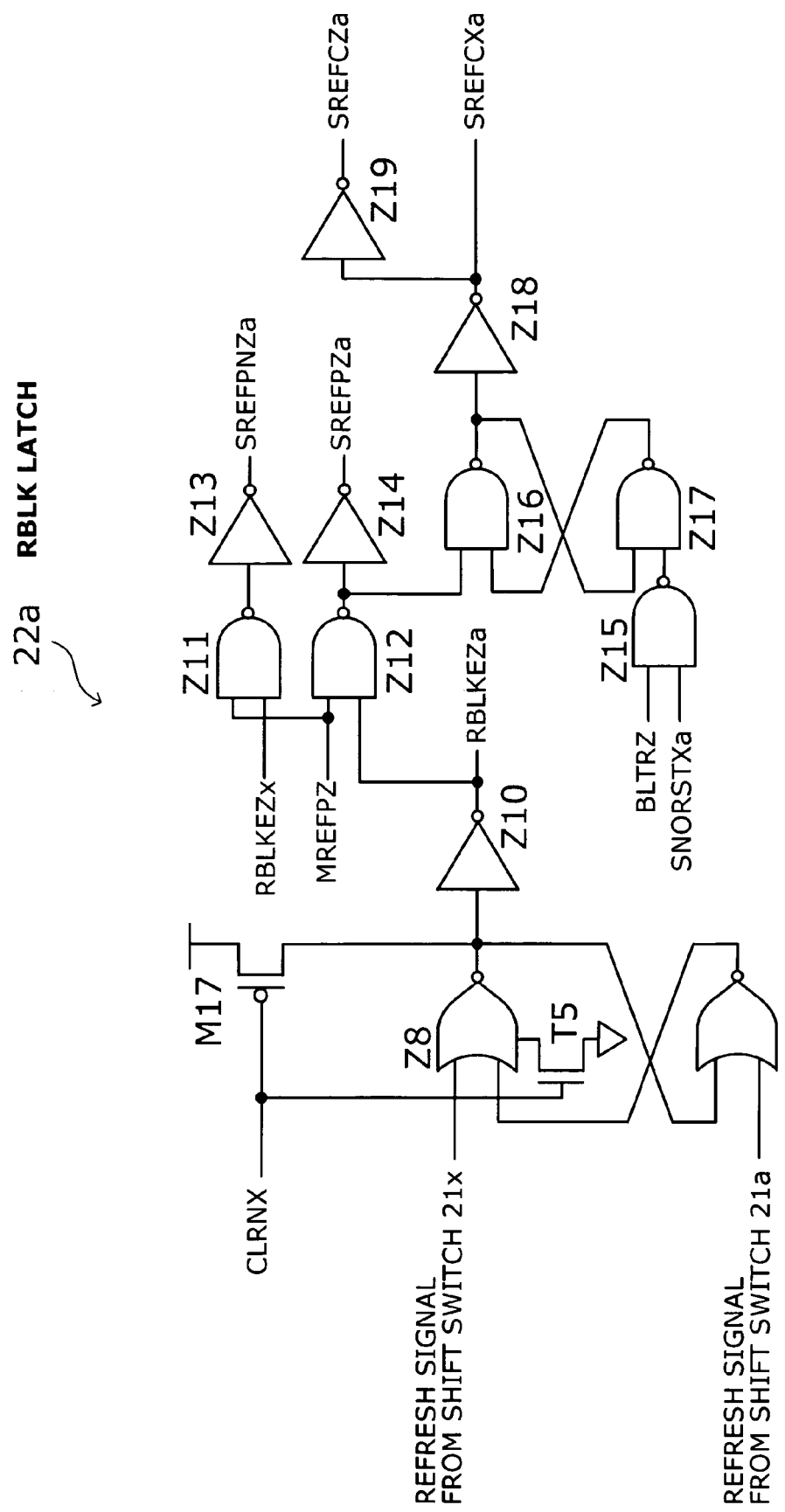
FIG. 6 is a schematic circuit diagram of an RBLK latch.

FIG. 6 is a schematic circuit diagram showing an example of RBLK latch structure. The illustrated RBLK latch 22a is composed of the following elements: NOR gates Z8 and Z9, inverters Z10, Z13, Z14, Z18, and Z19, NAND gates Z11, Z12, Z15, Z16, and Z17, and transistor M17 and T5.

Two NOR gates Z8 and Z9 constitute a flip-flop. The first NOR gate Z8 receives a refresh signal from the preceding shift switch 21x when the preceding cell array 11x is about to leave the current refresh process. The second NOR gate Z9 receives a refresh signal from the local shift switch 21a when the local cell array 11a is about to finish refresh mode. Those two refresh signals change the state of the NOR gates Z8 and Z9, functioning as a flip-flop, and that state is sent out through an inverter Z10 as a row block selection signal RBLKEZa. That is, an active row block selection signal RBLKEZa is produced as the inverter Z10's output when a refresh signal is received from the preceding shift switch 21x. This row block selection signal RBLKEZb becomes inactive, when a refresh signal is received from the local shift switch 21a. The negation of RBLKEZa signifies the end of refresh cycles in the local cell array 11a. The row block selection signal RBLKEZa as such is sent to the local shift command generator 23a. The signal RBLKEZa is also sent to the succeeding RBLK latch 22b in order to enable the sense amplifiers 12b.

The topmost NAND gate Z11 in FIG. 6 receives a row block selection signal RBLKEZx from the preceding RBLK latch, along with main refresh pulse signal MREFPZ. When the row block selection signal RBLKEZx is active, the NAND gate Z11 passes the main refresh pulse signal MREFPZ to the subsequent inverter Z13. The output of the inverter Z13 is referred to as the subordinate refresh pulse SREFPNZa. Since sense amplifiers 12a and 12b are shared by neighboring cell arrays, the RBLK latch 22a has to output subordinate refresh pulse signals SREFPNZa when the preceding cell array 11x enters refresh mode.

The second NAND gate Z12 receives a row block selection signal RBLKEZa from the inverter Z10, along with main refresh pulse signal MREFPZ. When the row block selection signal RBLKEZa is active, the NAND gate Z12 passes the main refresh pulse signal MREFPZ to the subsequent inverter Z14. The output of the inverter Z14 is referred to as the subordinate refresh pulses SREFPZa. The RBLK latch 22a supplies those subordinate refresh pulses SREFPZa to the control signal generator 24a serving the local cell array 11a.

The bottommost NAND gate Z15 receives a block reset signal BLTRZ and an external/internal address switching disable signal SNORSTXa, both of which are among the miscellaneous control signals CSIG shown in the bottom-left corner of FIG. 2. The block reset signal BLTRZ goes low when disconnecting active sense amplifiers from inactive cell arrays, and it goes high when connecting them. The external/internal address switching disable signal SNORSTXa becomes high when the cell array 11a is available for read/write operation. It is set to low when the cell array 11a is in refresh mode. During a refresh process, this external/internal address switching disable signal SNORSTXa locks the state of corresponding address switching signals SREFCXa and SREFCZa, so that the word line decoders 13a(0) to 13a(63) will keep selecting the internally generated address. As long as the external/internal address switching disable signal SNORSTXa is asserted, the NAND gate Z15 does not allow the block reset signal BLTRZ to reach the subsequent gates.

The remaining two NAND gates Z16 and Z17 are combined as a flip-flop. The NAND gate Z16 receives the output of the NAND gate Z12, and the NAND gate Z17 receives the output of the NAND gate Z15. That is, the flip-flop of Z16 and Z17 is set by the signal that the NAND gate Z12 produces in synchronization with the main refresh pulse signal MREFPZ. The flip-flop is cleared by a reset signal BLTRZ, which is allowed only when the external/internal address switching disable signal SNORSTXa is high. The output of this flip-flop is reversed by two subsequent inverters Z18 and Z19, and the resulting complementary signals are supplied to word line decoders 13a(0) to 13a(63) as address switching signals SREFCXa and SREFCZa.

Referring to the top-left portion of FIG. 6, initialization signal CLRNX is among the miscellaneous control signals CSIG. Transistor M17 is a p-channel MOSFET, whose drain and source are connected to the output of the NOR gate Z8 and a high-side supply voltage, respectively. Another transistor T5 is an n-channel MOSFET, which controls the low-side output of NOR gate Z8. The initialization signal CLRNX, when asserted, turns on the p-channel transistor M17 and turns off the n-channel transistor T5. As a result, the flip-flop of Z8 and Z9 is set to high state.

While we have described the RBLK latch 22a, the other RBLK latch 22b shown in FIG. 2 is constructed in the same way. We will therefore omit the explanation for the RBLK latch 22b here.

Shift Command Generator

Referring back to FIG. 2, the illustrated memory device has a shift command generator 23 for each cell array 11. Specifically, the illustrated shift command generators 23a and 23b receive a main shift clock signal MSFTX, which is a clock signal alternating between high and low states. The shift command generator 23a produces subordinate shift command signals SSFTXa and SSFTZa as long as the row block selection signal RBLKEZa is provided from the RBLK latch 22a. Likewise, the shift command generator 23b produces subordinate shift command signals SSFTXb and SSFTZb as long as the row block selection signal RBLKEZb is provided from the RBLK latch 22b. Further, the shift command generator 23a keeps producing shift command signals SSFTXa and SSFTZa for a predetermined period (one clock cycle) after the row block selection signal RBLKEZa is negated. Likewise, the shift command generator 23b keeps producing subordinate shift command signals SSFTXb and SSFTZb for a predetermined period after the row block selection signal RBLKEZb is negated. Such extra shift command signals permit the activated last-stage shift register 19a(64) or the like to be clocked one more time and thus return to an inactive state.

Figure 7:
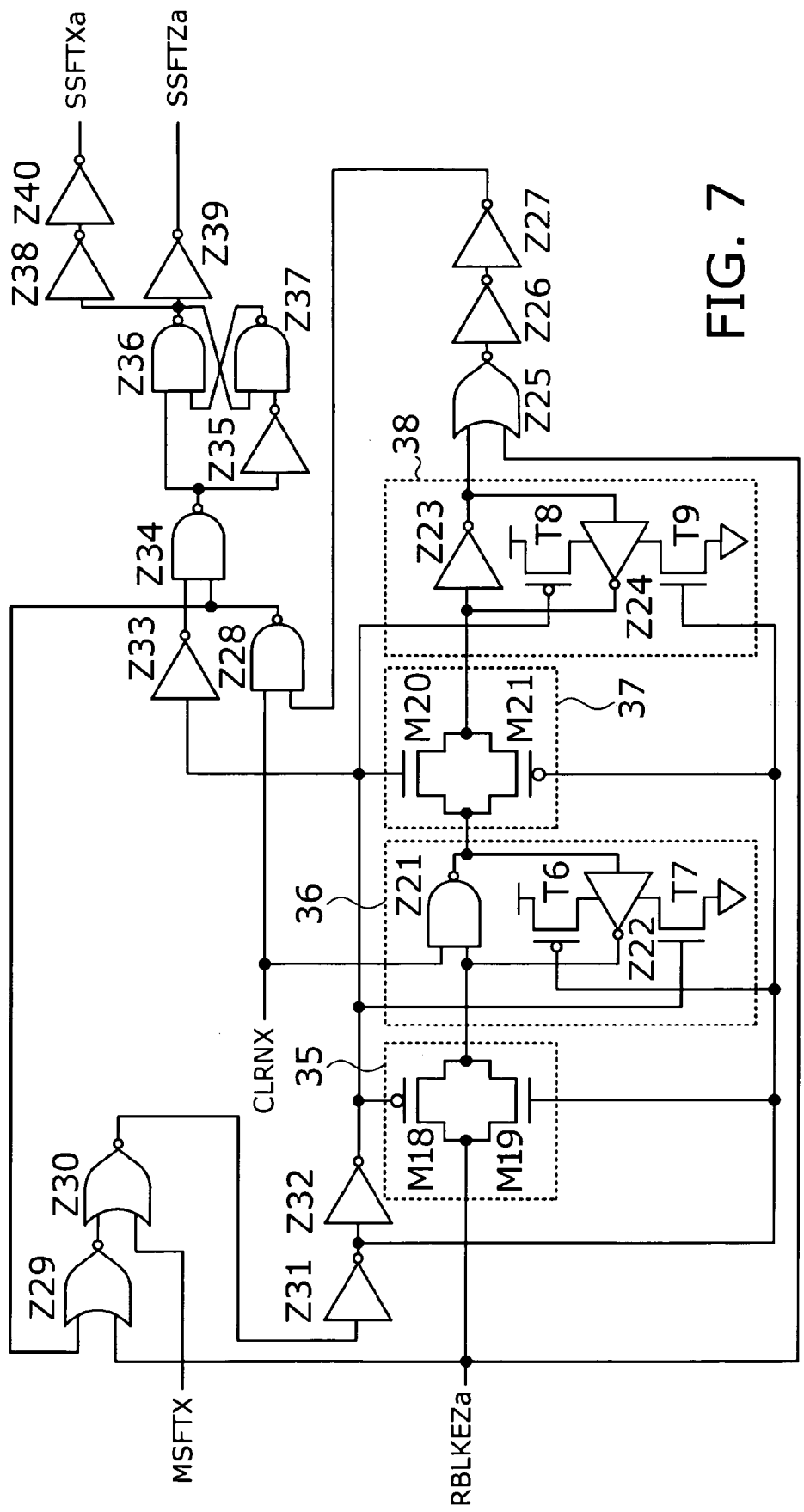
FIG. 7 is a schematic circuit diagram of a shift command generator.

FIG. 7 is a schematic circuit diagram showing an example of the shift command generators 23. The illustrated shift command generator 23a is composed of two transfer gates 35 and 37, two latches 36 and 38, three NOR gates Z25, Z29, and Z30, nine inverters Z26, Z27, Z31 to Z33, Z35, Z38 to Z40, and four NAND gates Z28, Z34, Z36, and Z37.

The first transfer gate 35 is composed of two transistors M18 and M19, the former being a p-channel MOSFET, and the latter being an n-channel MOSFET. Given to the input is a row block selection signal RBLKEZa. The transfer gate 35 transfers this signal RBLKEZa to the subsequent latch circuit 36, in response to the main shift clock signal MSFTX, which is supplied through a NOR gate 30 and inverters Z31 and Z32.

The latch circuit 36 is composed of a NAND gate Z21, an inverter Z22, and transistors T6 and T7. This latch circuit 36 captures and holds the row block selection signal RBLKEZa from the transfer gate 35, making it available to another transfer gate 37 that follows. The initialization signal CLRNX given to the NAND gate Z21 initializes the subordinate shift command signals SSFTXa and SSFTZa. Transistors T6 (p-channel MOSFET) and T7 (n-channel MOSFET) are attached to the inverter Z22. Both transistors T6 and T7 turn off when the preceding transfer gate 35 is active, thus disabling the inverter Z22 from driving its load. This additional circuit ensures reliable signal transfer operation from the transfer gate 35 to the latch circuit 36.

The second transfer gate 37 is composed of two transistors M20 and M21, the former being an n-channel MOSFET, and the latter being a p-channel MOSFET. This transfer gate 37 forwards the row block selection signal RBLKEZa from the first latch circuit 36 to the second latch circuit 38, in response to the main shift clock signal MSFTX.

The second latch circuit 38 is composed of two inverters Z23 and Z24 and two transistors T8 and T9 this latch circuit 38 captures and holds the row block selection signal RBLKEZa from the second transfer gate 37, making it available to a NOR gate Z25 that follows. The two transfer gates 35 and 37 always have opposite states; i.e., when one turns on, the other turns off, and vice versa. Transistors T8 (p-channel MOSFET) and T9 (n-channel MOSFET) are attached to the inverter Z24. Both transistors T8 and T9 turn off when the preceding transfer gate 37 is active, thus disabling the inverter Z24 from driving its load. This additional circuit ensures reliable signal transfer operation from the transfer gate 37 to the latch circuit 38.

When the row block selection signal RBLKEZa is removed from the input of the transfer gate 35, the active state of RBLKEZa still remains in the first latch circuit 36, and that state is transferred to the second latch circuit 38 through the second transfer gate 37 that turns on at the next falling edge of the main shift clock signal MSFTX. The row block selection signal RBLKEZa thus appears at the output of the second latch circuit 38 with a delay of one cycle period of the main shift clock signal MSFTX, relative to the original row block selection signal RBLKEZa given at the input of the first transfer gate 35, which is now removed. This delayed version of the row block selection signal RBLKEZa is then sent to the NOR gate Z25.

The NOR gate Z25 combines the original row block selection signal RBLKEZa and its delayed version explained above. The original row block selection signal RBLKEZa goes through the NOR gate Z25 and reaches the subsequent inverter Z26, and even when that RBLKEZa is negated, the delayed row block selection signal RBLKEZa from the second latch circuit 35 is still there. Accordingly, the row block selection signal RBLKEZa appearing at the output of the inverter Z26 is an extended version of RBLKEZa that lasts one MSFTX-cycle longer than the original row block selection signal RBLKEZa.

The extended row block selection signal RBLKEZa is sent from the inverter Z26 to a NAND gate Z28 via another inverter Z27. The other input given to the NAND gate Z28 is an initialization signal CLRNX. Since the initialization signal CLRNX is an active-low signal, the output of the NAND gate Z28 is forced to be high when CLRNX is asserted. The NAND gate Z28 actually produces a logical sum of the initialization signal CLRNX and the extended row block selection signal RBLKEZa, which is then sent to a NAND gate Z34 and NOR gate Z29. The NOR gate Z29 combines this logical sum signal with the original row block selection signal RBLKEZa, which comes from the RBLK latch 22a, and sends an inverted version of the result to another NOR gate Z30 that follows. The NOR gate Z30 actually produces a logical product of two low-active inputs. When the NOR gate Z29 gives a low signal derived from the initialization signal CLRNX, the NOR gate Z30 outputs a high signal to the subsequent inverter Z31 since the main shift clock signal MSFTX at the other input of Z30 is also driven to low by some other circuit (not shown) during the initialization period. Another case that the NOR gate Z29 gives a low signal to the NOR gate Z30 is when the original or extended version of the row block selection signal RBLKEZa is active. The NOR gate Z30 then allows the main shift clock signal MSFTX to reach the inverter Z31.

When the extended row block selection signal RBLKEZ is active at the NAND gate Z28's output, the NAND gate Z34 delivers the main shift clock signal MSFTX to a NAND gate Z36, as well as to another NAND gate Z37 via an inverter Z35. The two NAND gates Z36 and Z37 form a flip-flop. The main shift clock signal MSFTX at the output of the NAND gate Z36 goes to the shift registers 19a(1) to 19a(64) via inverters Z38 and Z40, which is used as a low-active subordinate shift command signal SSFTXa. The main shift clock signal MSFTX at the output of the NAND gate Z36 is also inverted by an inverter Z39 for delivery as a high-active subordinate shift command signal SSFTZa to the shift registers 19a(1) to 19a(64).

The functions of the shift command generator 23a as a whole can thus be summarized as follows: the shift command generator 23a produces subordinate shift command signals SSFTXa and SSFTZa from a given main shift clock signal MSFTX, during the period when the row block selection signal RBLKEZa is in the active state. The shift command generator 23a further outputs an extra SSFTXa and SSFTZa for another cycle period of MSFTX after the row block selection signal RBLKEZa is negated. This extra shift command permits the last-stage shift register 19a(64) to clear out its content.

Referring back to FIG. 2, the control signal generators 24 receive subordinate refresh pulses SREFPZa, SREFPNZa, SREFPZb, SREFPNZb, or the like from their associated RBLK latches 22. The control signal generators 24 also receive a control signal CSIG, as well as an RBLK selection address signal SELAD that specifies which local cell array 11 to refresh. When those signals are given, the control signal generators 24 produce an amplifier control signal ACTLa, ACTLb, or the like and a main word line control signal MWLa, MWLb, or the like. The sense amplifiers 12 operate according to their respective amplifier control signals ACTLa, ACTLb, and so on and main word line controls signal MWLa, MWLb, and so on. Main word line control signal MWLa derives the voltage BKEX explained earlier in FIG. 3.

Memory Operation

While we have described the functions of individual elements of the proposed semiconductor memory device, this section will explain how the circuit of FIG. 2 operate in its entirety. Suppose now that the shift switch 21x has sent a refresh signal to its succeeding RBLK latch 22a. The RBLK latch 22a responds to this signal by providing its local word line decoders 13a(0) to 13a(63) with address switching signals SREFCXa and SREFCZa to indicate the presence of a refresh request. The word line decoders 13a(0) to 13a(63) are activated one at a time by refresh signals REFA00a to REFA63a given from the shift registers 19a(1) to 19a(64). When activated, each word line decoder 13a(0) to 13a(63) produces a signal for driving a particular main word line of their local cell array 11a and sends it to the corresponding redundancy circuits 17a(0) to 17a(64).

On the other hand, the RBLK latch 22a asserts a row block selection signal RBLKEZa for use in the local shift command generator 23a and the succeeding RBLK latch 22b. The RBLK latch 22a also begins sending subordinate refresh pulses SREFPZa to the control signal generator 24a. In response to the row block selection signal RBLKEZa from the RBLK latch 22a, the shift command generator 23a produces subordinate shift command signals SSFTXa and SSFTZa from the main shift clock signal MSFTX. The shift registers 19a(1) to 19a(64) output refresh signals REFA01a to REFA63a successively in synchronization with given subordinate shift command signals SSFTXa and SSFTZa.

The RBLK latch 22b responds to the row block selection signal RBLKEZa from the preceding RBLK latch 22a by sending subordinate refresh pulses SREFPNZb to its local control signal generator 24b. The control signal generator 24b thus outputs an amplifier control signal ACTLb, which causes the sense amplifiers 12b to serve the cell array 11a.

Shift flag signal FLAG is initially in the low state, indicating that subordinate word lines of the cell array 11a have not been refreshed. This state of FLAG causes the shift switch 21a to feed a last refresh signal back to the first-stage shift register 19a(1) when it comes out of the last-stage shift register 19a(64). The shift registers 19a(1) to 19a(64) thus repeat another round of scanning word lines, successively generating refresh signals REFA01a to REFA63a.

When all subordinate word lines are finished, the shift flag signal FLAG goes high. Accordingly, the shift switch 21a forwards a final refresh signal from the last-stage shift register 19a(64) to the succeeding row block for use as a new refresh signal REFA00b in the first-stage shift register 19b(1) of the cell array 11b. This refresh signal is also directed to the RBLK latches 22a and 22b. In response to this, the RBLK latch 22a negates the row block selection signal RBLKEZa and stops feeding subordinate refresh pulses SREFPZa. Now that the external/internal address switching disable signal SNORSTXa is high, the RBLK latch 22a changes the state of address switching signals SREFCXa and SREFCZa to indicate that it is ready to accept data read/write requests. The refresh signal from the shift switch 21a further triggers the succeeding RBLK latch 22b to operate similarly to the above-described RBLK latch 22a, so that its local cell array 11b will be refreshed.

Figure 8:
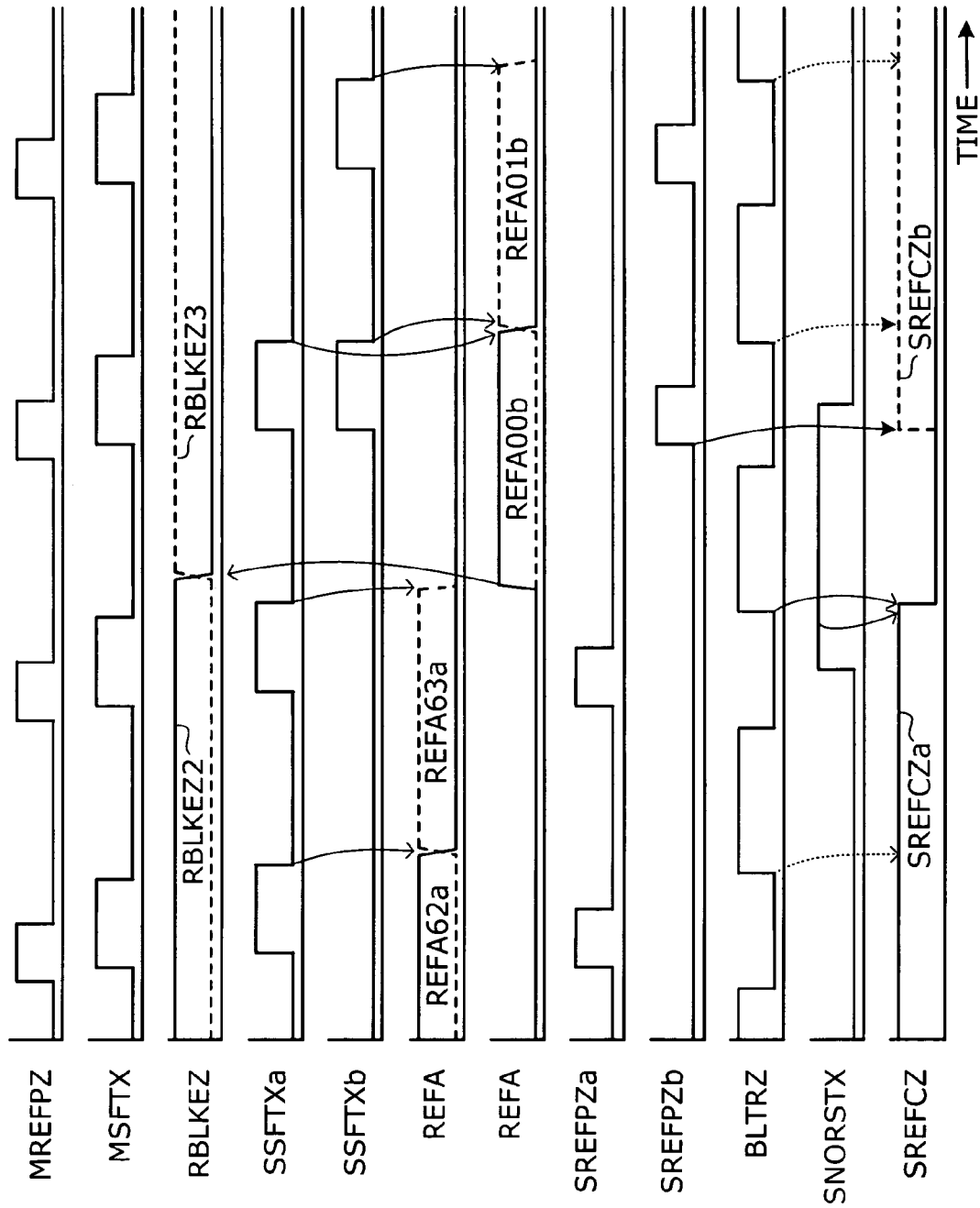
FIG. 8 is a timing diagram which shows how the control is passed from one cell array to another in refresh operation.

Memory refresh is performed on an array-by-array basis. Referring now to the timing diagram of FIG. 8, we will look into how this switching is achieved. FIG. 8 shows signal waveforms in a transient period where the refresh control is transferred from one cell array 11a to another cell array 11b.

As FIG. 8 shows, the RBLK latch 22a creates subordinate refresh pulses SREFPZa from main refresh pulses MREFPZ, while the shift command generator 23a produces a subordinate shift command signal SSFTXa from the main shift clock signal MSFTX. The shift register 19a(63) captures the state of refresh signal REFA62a at the rising edge of the subordinate shift command signal SSFTXa and outputs it as a new refresh signal REFA63a at the falling edge of the same.

Simultaneously with the falling edge the refresh signal REFA63a, the shift switch 21a outputs a refresh signal REFA00b, which is actually sent from the last-stage shift register 19a(64). This event deactivates the present row block selection signal RBLKEZa and activates the next row block selection signal RBLKEZb, instead.

The shift command generator 23a produces one more pulse of subordinate shift command signal SSFTXa after the row block selection signal RBLKEZa is deactivated. This extra SSFTXa causes the shift register 19a(64) to remove the source of the refresh signal REFA00b. The shift command generator 23b produces a subordinate shift command signal SSFTXb, thus allowing its local shift registers 19b(1) to 19b(64) (not all shown) to successively produce refresh signals REFA01b, REFA02b, and so on.

Shown on the third from the bottom row of FIG. 8 is a block reset signal BLTRZ, which is an active-high reset signal. As mentioned earlier in FIG. 6, the block reset signal BLTRZ cannot stop the generation of active-high address switching signal SREFCZ and its active-low counterpart SREFCX (which indicate that the cell array 11a is in refresh mode) as long as the external/internal address switching disable signal SNORSTXa is asserted to low.

Figure 9:
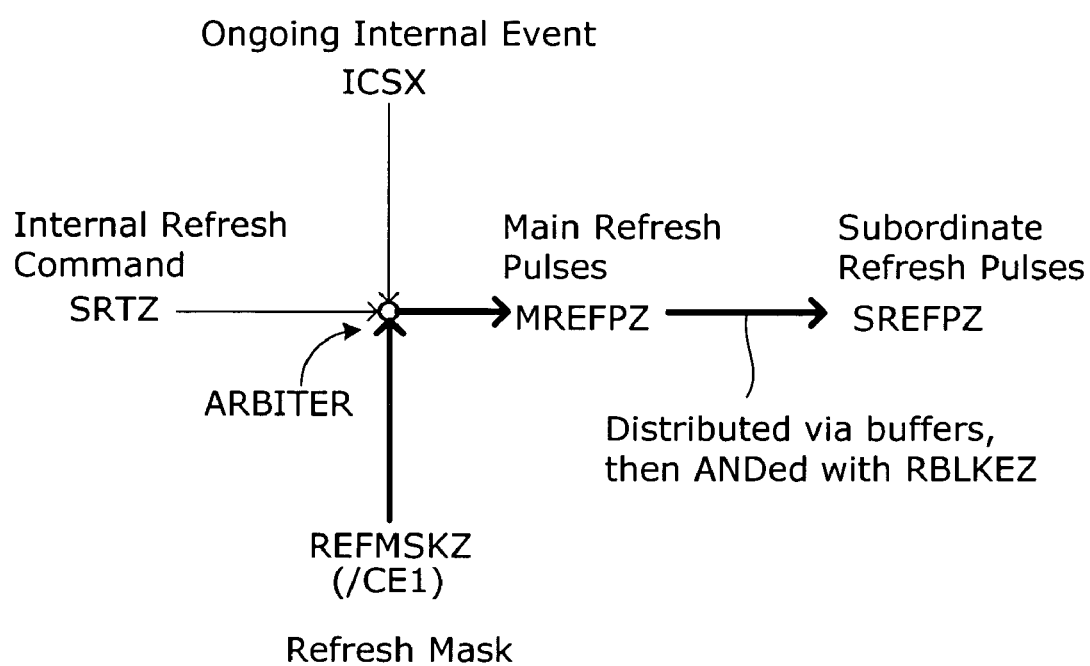
FIG. 9 shows a critical path that must be followed to initiate refresh operation.

FIG. 9 shows a critical path that must be followed to initiate refresh operation. The round symbol represents an arbiter, and the bold arrows indicate the critical path. The arbiter is an integral part of the semiconductor memory device. Its function is to determine in what order to process given input signals, and to distribute those signals to their relevant processing circuits.

The arbiter receives an active-low internal event status signal ICSX that indicates the presence of some ongoing internal event. Specifically, when ICSX is high, the arbiter permits other input signals to be serviced in the order of arrival. When ICSX is low, the arbiter suspends external commands and refresh request until the ongoing internal event is finished. The diagram of FIG. 9 assumes a high (inactive) state for this internal event status signal ICSX.

Another input to the arbiter is an internal refresh command SRTZ, which represents a refresh request produced by a control circuit inside the device. Yet another input to the arbiter is a refresh mask signal REFMSKZ, which requests a halt of refresh operation. This refresh mask signal REFMSKZ is derived from an externally controlled chip enable signal /CE1. Specifically, the chip enable signal /CE1 indicates a read/write attempt from external circuitry, or a transition of the device itself to an output disable state.

Once an internal refresh command SRTZ is recognized and allowed by the arbiter, the relevant control circuit in the semiconductor memory device generates main refresh pulses MREFPZ and distributes them to the RBLK latches 22 through a buffer circuit (not shown in FIG. 2). As described in FIG. 6, those main refresh pulses MREFPZ are then ANDed with a row block selection signal RBLKEZx, RBLKEZa, or the like for use as subordinate refresh pulse SREFPZa, SREFPZb, and the like.

Figure 10:
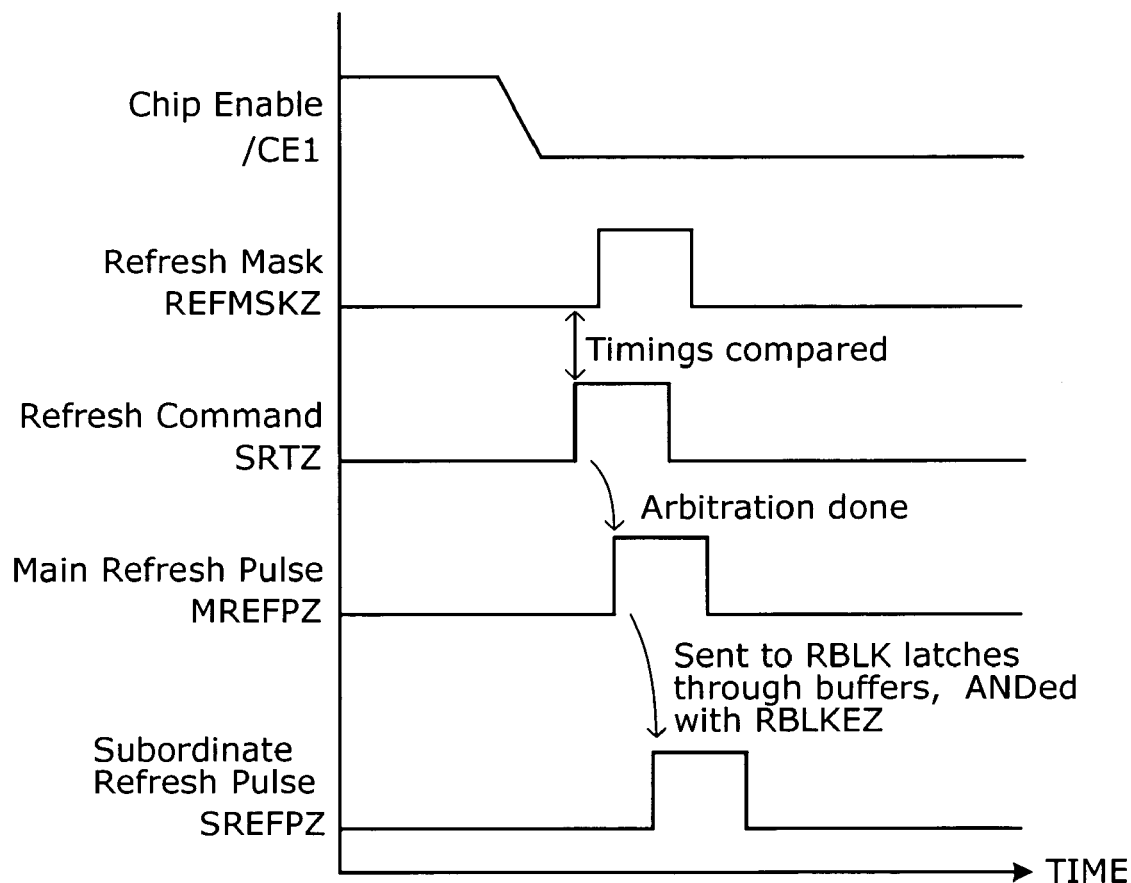
FIG. 10 is a timing diagram explaining a critical path that must be followed to initiate refresh operation.

FIG. 10 is a timing diagram explaining a critical path that must be followed to initiate refresh operation. As seen, the process begins with assertion of chip enable signal /CE1, which activates refresh mask signal REFMSKZ. If there is an active internal refresh command SRTZ that has reached the arbiter earlier than the refresh mask signal REFMSKZ, the corresponding control circuit starts to generate main refresh pulses MREFPZ. The main refresh pulses MREFPZ are supplied to RBLK latch circuits 22 through buffers, and then ANDded with row block selection signals RBLKEZa, RBLKEZb, and so on. The resulting signals are sent out as subordinate refresh pulses SREFPZa, SREFPZb, or the like thus enabling refresh cycles to start.

In the refresh process according to the present invention, the word lines are addressed successively by the shift registers 19. Conventional memory refresh mechanisms using an address counter spend time to fetch and decode address signals, wait for internal address to settle and activate a cell array, and activate timing signals. In contrast to this, the semiconductor memory device of the present invention needs no such time margins. While the above example is about memory access time from chip enable signal /CE1, the same advantage applies to address access time and other performance factors of memory devices.

To summarize this section, the first embodiment of the invention provides RBLK latches 22 designed to send a subordinate shift command signal to a limited number of shift registers 19 that are currently generating main word line selection signals to refresh a cell array 11. This structure reduces the amount of electrical current consumed in driving subordinate shift command lines.

Second Embodiment

Figure 11:
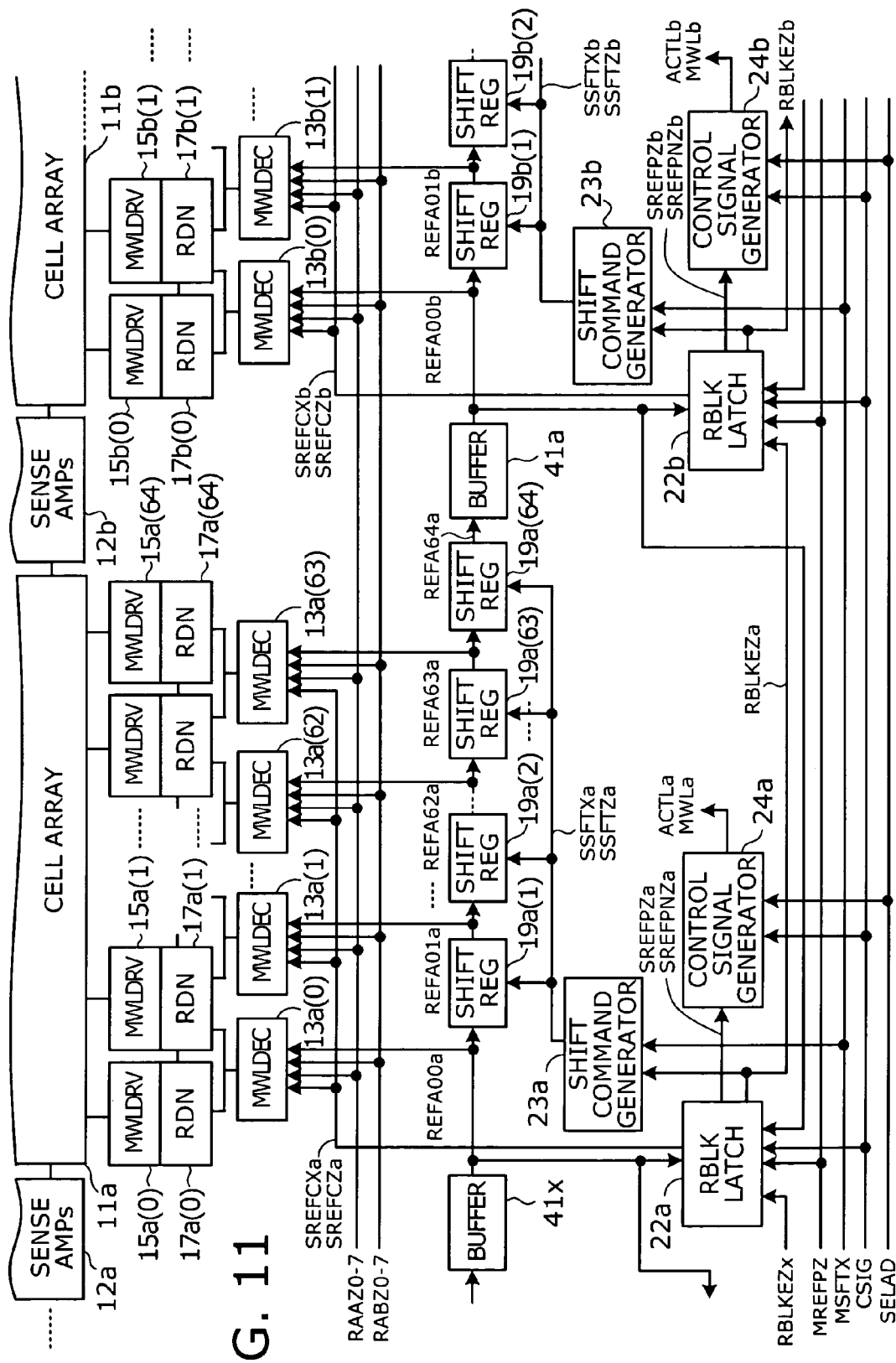
FIG. 11 is a schematic circuit diagram of a semiconductor memory device according to a second embodiment of the invention.

This section will describe a second embodiment of the present invention. FIG. 11 is a schematic circuit diagram of a semiconductor memory device according to a second embodiment of the invention. The illustrated semiconductor memory device differs from the device of FIG. 2 in that it employs buffers 41x and 41a in place of shift switches 21x and 21a. In the semiconductor memory device of FIG. 2, the shift switch 21a controls shift registers 19a(1) to 19a(64) such that their refresh signals REFA00a to REFA63a will circulate until all subordinate word lines of the corresponding cell array 11a are refreshed. The other shift switch 21x operates in the same way. The device of FIG. 11, on the other hand, is designed to advance the refresh process without waiting completion of all subordinate word lines of each cell array 11. That is, the refresh process scans all cell arrays 11 by successively activating main word lines, but not changing subordinate word line address. When one round of such scanning is finished, the next round starts with a different subordinate word line address. This is repeated until all subordinate word lines are refreshed. The following section will provide details of the second embodiment. Because the second embodiment (FIG. 11) shares many components with the first embodiment (FIG. 2), we will omit the explanation of such common components, while affixing the same reference numerals to them.

Referring to FIG. 11, the illustrated memory device has buffers 41x, 41a, and so on (collectively referred to by the numeral "41") that are assigned to individual cell arrays 11x, 11a, 11b, and so on. Specifically, the buffer 41a transfers a refresh signal from the last-stage shift register 19a(64) to the subsequent shift register 19b(1), as well as to the local RBLK latch 22a and preceding RBLK latch 22b. Likewise, the buffer 41x receives a refresh signal from the last-stage shift register (not shown) of the cell array 11x. The buffer 41a transfers that refresh signal to its local RBLK latch (not shown) as well as to the first-stage shift register 19a(1) and RBLK latch 22a of the succeeding cell array 11a that is to be refreshed next.

The buffers 41 have no particular control inputs. This is unlike the device of the first embodiment (FIG. 2), in which the shift switches 21 are controlled by a shift flag signal FLAG. The buffers 41 in the second embodiment simply forward a refresh signal from the preceding shift register to the succeeding shift register immediately when it is produced. The refresh process therefore proceeds from one cell array to another without finishing all subordinate word lines at each cell. When the last cell array is reached, the process goes back to the first cell array and starts another round in a similar way, but selecting the next unfinished subordinate word line address.

As can be seen from the above, the semiconductor memory device of the second embodiment is designed to repeat a simple circulation of a refresh signal through a large loop of shift registers and buffers, involving the entire set of cell arrays. Besides eliminating the wiring of shift flag signals FLAG, this architecture requires no feedback path of a refresh signal from a last-stage shift register to a first-stage shift register. The second embodiment is advantageous in terms of simplicity of refresh control circuit.

The second embodiment also inherits the power saving feature from the first embodiment. That is, the RBLK latches 22 send a subordinate shift command signal to only a limited number of shift registers 19 that are currently active. This structure reduces the amount of electrical current consumed in driving subordinate shift command lines.

Third Embodiment

Figure 12:
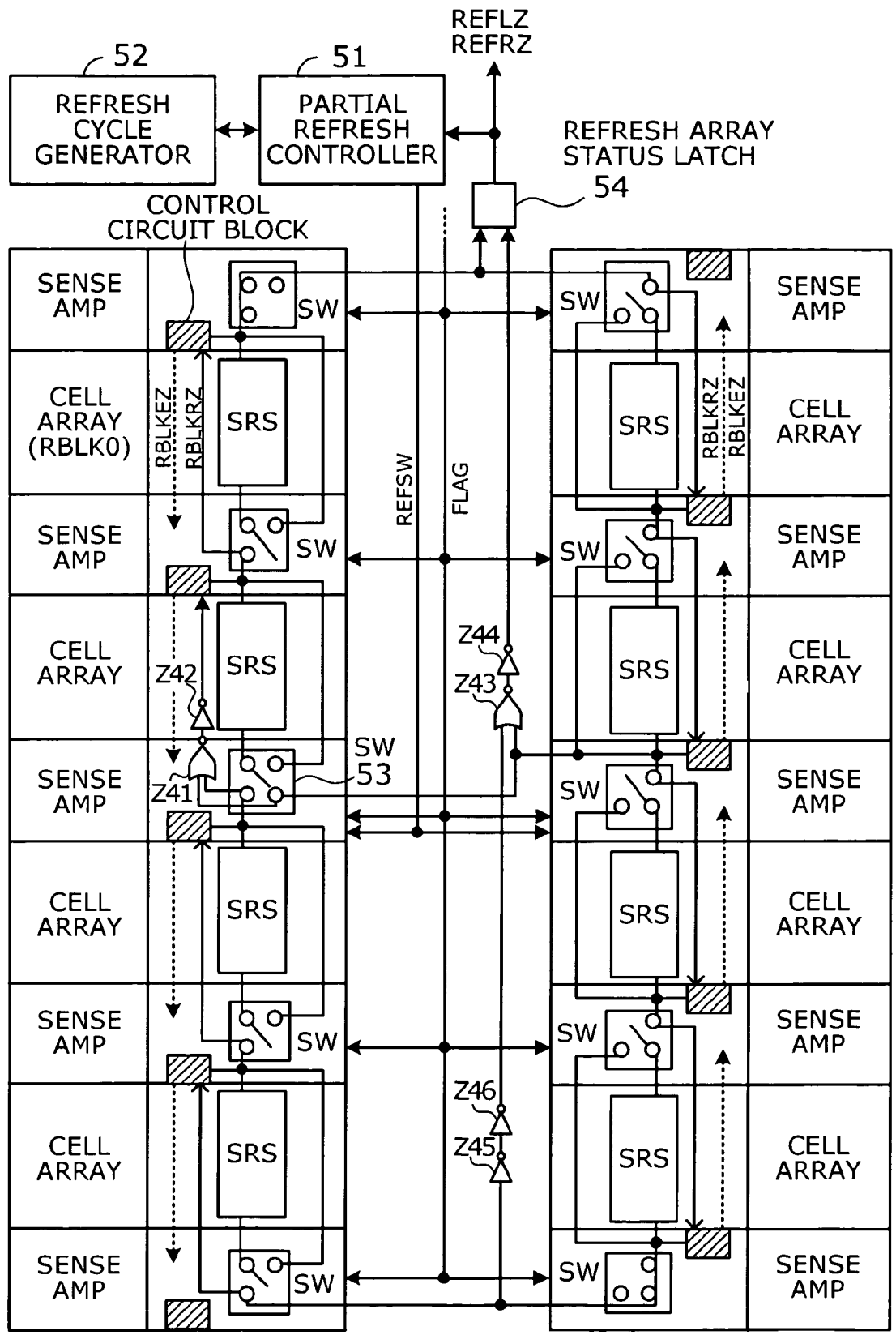
FIG. 12 is a schematic circuit diagram of a semiconductor memory device according to a third embodiment of the invention.

This section describes a third embodiment of the present invention. FIG. 12 is a schematic circuit diagram of a semiconductor memory device according to a third embodiment of the invention. Unlike FIG. 2, FIG. 12 provides a wider perspective of a proposed semiconductor memory device. The illustrated memory device, however, is different from the device of FIG. 2 in that the cell arrays can be refreshed in partial refresh mode. Despite this difference, the two devices are similar in most part. More specifically, the cell arrays shown in FIG. 12 correspond to the cell arrays 11 explained in FIG. 2. Sense amplifiers in FIG. 12 correspond to the sense amplifiers 12 explained in FIG. 2. Shift register sets (SRS) in FIG. 12 correspond to the shift registers 19 explained in FIG. 2. Switches (SW) in FIG. 12 correspond to the shift switches 21 explained in FIG. 2, except that one switch 53 is added a function that the shift switches 21 do not have. Control circuit blocks represented by the hatched rectangles in FIG. 12 include the RBLK latches 22, shift command generators 23, and control signal generators 24 explained in FIG. 2. RBLKEZ (indicated by the dotted arrows) in FIG. 12 are what we described in FIG. 2 as the row block selection signals RBLKEZx, RBLKEZa, and so on. RBLKRZ in FIG. 12 corresponds to the refresh signal path that extends from each shift switch 21 to its preceding RBLK latch 22. FLAG in FIG. 12 corresponds to the shift flag signal FLAG in FIG. 2.

In addition to the components named above, the semiconductor memory device of FIG. 12 has the following elements: a partial refresh controller 51, a refresh cycle generator 52, a refresh array status latch 54, NOR gates Z41 and Z43, and inverters Z42, Z44, Z45, and Z46.

Cell arrays are blocks of memory cells arranged in matrix form, each block containing a predetermined number of rows (or word lines). Those cell arrays are divided into two large groups. In partial refresh mode, the refresh process is interrupted in the middle of one group of cell arrays, and the control is transferred to the other group of cell arrays to continue the process. In the example of FIG. 12, cell arrays are divided into the left group and right group.

The partial refresh controller 51 accepts a partial refresh request from external circuitry, when the refresh process has returned to a predefined start point. Upon receipt of such a partial refresh request, the partial refresh controller 51 produces a refresh area switching signal REFSW. In a partial refresh process, the partial refresh controller 51 initiates individual refresh cycles at the intervals specified by the refresh cycle generator 52. When terminating the partial refresh mode, the partial refresh controller 51 first expands the refresh area to the original entire memory area and then resets the refresh interval to normal interval.

The refresh cycle generator 52 produces refresh timing signals for use in partial refresh operation. Usually the refresh cycle generator 52 specifies a prescribed interval for normal refresh mode, which covers the entire memory area. In partial refresh mode, the refresh cycle generator 52 varies the refresh interval according to the ratio of partial refresh area size to total memory size.

The switch 53 functions as follows. When a final refresh signal appears at the output of the local shift register set, the switch 53 normally forwards it to the succeeding shift register set. The exception is when a refresh area switching signal REFSW is given from the partial refresh controller 51. In this case, the switch 53 directs the refresh signal, not to the succeeding shift register set, but to the control circuit block of one cell array belonging to the other group (right group in FIG. 12). The NOR gate Z41 adjacent to the switch 53 receives the refresh signal, whether the switch 53 has directed it to the right cell array group or the succeeding shift register. The NOR gate Z41 sends this refresh signal through an inverter Z42 to the local control circuit block that serves the local shift register set.

The logic formed from a NOR gate Z43 and inverters Z44 to Z46 detects the transfer of a refresh signal from one group to the other (from the left group to the right group in FIG. 12) and notifies the refresh array status latch 54 of that event. The refresh array status latch 54 is also monitoring the other direction, i.e., from the right group to the left group. Monitoring those refresh signals transferred across the groups permits the refresh array status latch 54 to recognize which group of cell arrays is currently refreshed. Based on this knowledge, the refresh array status latch 54 asserts either one of two refresh area signals REFLZ or REFRZ. More specifically, REFLZ is set to low, and REFRZ is set to high, when a refresh signal has been transferred from the left group to the right group. REFLZ is set to high, and REFRZ is set to low, when a refresh signal has been transferred from the right group to the left group.

Figure 13:
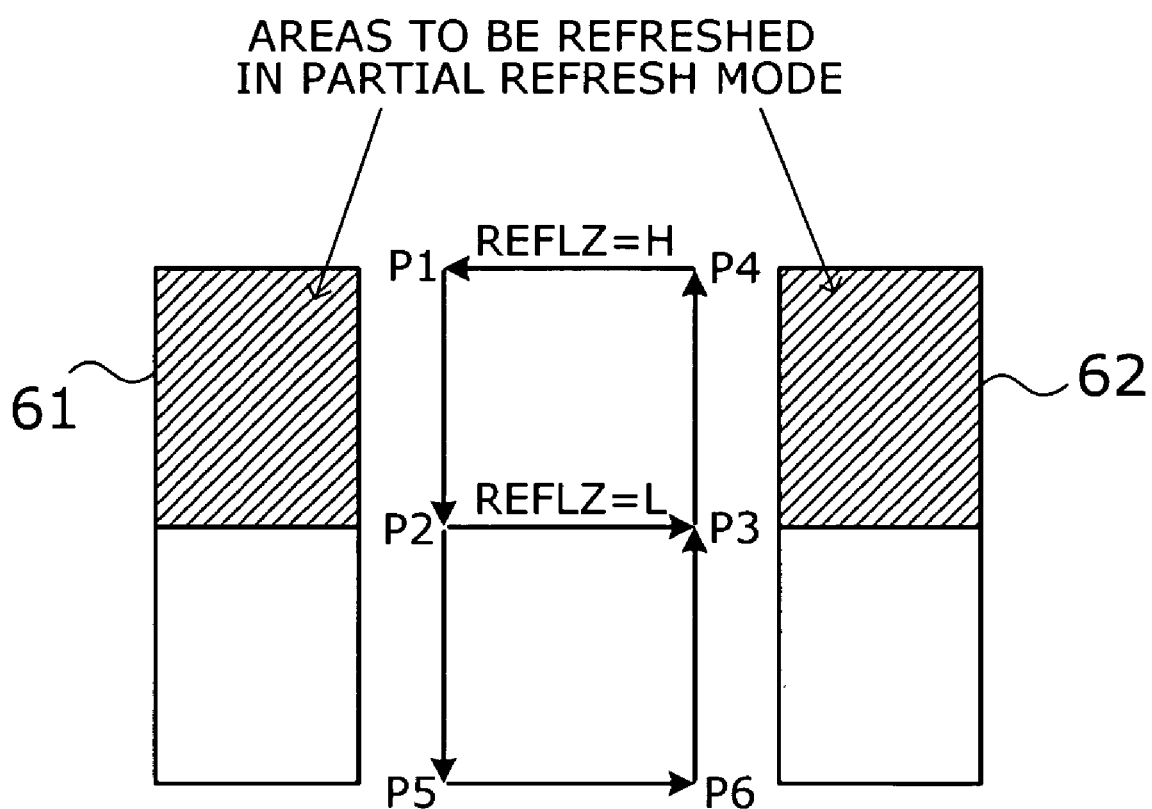
FIG. 13 shows the entry to and exit from partial refresh mode and explains how refresh loops are created.

FIG. 13 shows the entry to and exit from partial refresh mode and how refresh loops are created. The cell array group 61 shown on the left represents the cell arrays located on the left-hand side of FIG. 12. The other cell array group 62 represents the cell arrays located on the right-hand side of FIG. 12. The symbols P1 to P6 and associated arrows shown in FIG. 13 indicate in what order the cell array groups 61 and 62 are refreshed. The hatched sections of those cell array groups 61 and 62 represent the areas to be refreshed in partial refresh mode.

FIG. 14 is a table showing the relationship between refresh areas shown in FIG. 13 and refresh intervals. The symbol "CE2" in this table means an input signal that allows external circuitry to direct the memory device to operate in partial refresh mode. The memory device performs normal refresh over the entire memory area when CE2 is high. Setting CE2 to low enables partial refresh. The AREA SIZE field of the table indicates the ratio of partial refresh area to the entire cell array area. For example, the AREA SIZE value "½" in the third row means that only half the total cell array area is refreshed in partial refresh mode.

Enabling partial refresh mode with a high-to-low transition of CE2 alone would cause a problem. Suppose, for example, that CE2 is asserted when a refresh process is proceeding from point P2 to P5. Hastily changing the setup of refresh area and interval in response to this event would make it impossible for a refresh signal to be passed from point P3 to P4. For this reason, entry to partial refresh mode has to be deferred until the refresh signal returns to the initial point P1. As mentioned earlier, the refresh area signal REFLZ becomes high when a circulating refresh signal returns from the right group to the left group. That is, the high level of REFLZ suggests that the left group of cell arrays is ready to begin a partial refresh process from the initial point P1. The partial refresh controller 51 then sets the refresh area to "×1/2" (half the entire area), and the refresh cycle generator 52 sets the refresh interval to "×2" (double the normal interval).

Another issue to consider is how to exit from partial refresh mode when the process is exactly at the branch point P2. The problem here is that this situation could bring about two parallel refresh processes, one from P2 to P5 and the other from P3 to P4. Yet another problematic case is where the exit from partial refresh mode occurs immediately before the branch point P2. In this case the memory cells located at point P3 would remain unrefreshed for as long as (14/8)T (T: minimum refresh time required for data retention), because the path P3-P4-P1-P2 takes time T and P2-P5-P6-P3 takes time 6/8T. To meet the requirement of minimum refresh rate, the refresh interval has to be reduced by the factor of 8/14. For this reason, the exit from partial refresh mode in the present invention is designed to start with changing the refresh interval to half the normal interval upon detection of a low-to-high transition of CE2. The refresh area signal REFLZ goes high when the remaining partial refresh area is finished, and this event causes the refresh area to revert to normal "×1" (i.e., the entire area). The next round thus refreshes all cell arrays at double speed, which ends with the second occurrence of high REFLZ. The refresh interval is reset to the normal interval at this point.

The reason for halving the refresh interval before everything else is as follows. Suppose that the exit from partial refresh mode is triggered just after the point P1 is passed, immediately followed by a write operation to some address between P6 and P3. Since the path is not allowed to change to P1-P5-P6-P4 right away, the refresh process has to take the path of P1-P2-P3-P4 and then P1-P2-P5-P6-P3-P4. If refresh was done at the normal rate, the worst-case period for the above write address would amount to (5/4)T since the path P1-P2-P3-P4 takes time (1/2)T and P1-P5-P6-P3 takes time (3/4)T. To meet the requirement of minimum refresh rate, the refresh interval in partial refresh mode has to be set to 4/5 times the normal interval, resulting in an increased data retention current in standby mode. To avoid this undesirable current consumption, the refresh rate is temporarily raised when exiting from partial refresh mode.

As seen, the example of FIG. 12 assumes such a memory chip structure where cell arrays are split into a left and right blocks, and the control circuit is designed to switch the refresh areas and intervals at a reference point where a refresh process jumps from the right to the left. The present invention, however, should not be limited to this particular configuration. For example, the reference point may be set to another appropriate point on the refresh address space.

To summarize this section, the third embodiment of the present invention employs a switch 53 at a point in the loop of shift registers to change the flow of refresh control signals. According to the state of a refresh area switching signal REFSW indicating the presence of a partial refresh request, the switch 53 interrupts the ongoing refresh process in the middle of one of two major groups of cell arrays, so that the refresh process will continue in the other group of cell arrays. The present invention implements partial refresh mode in this way, which reduces the device's power consumption by limiting the number of cell arrays that need data refreshing.

Fourth Embodiment

Figure 15:
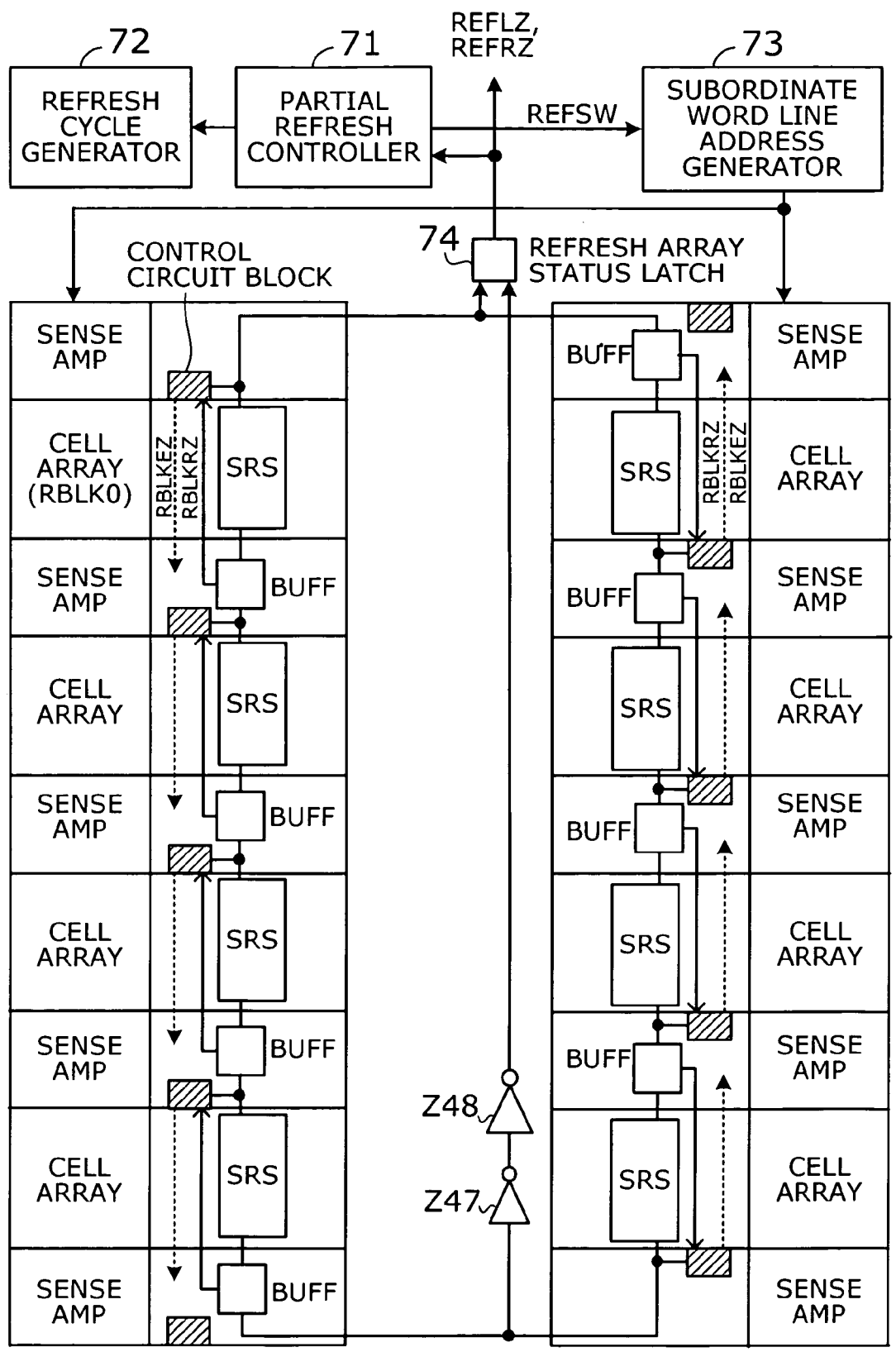
FIG. 15 is a schematic circuit diagram of a semiconductor memory device according to a fourth embodiment of the invention.

This section will describe a fourth embodiment of the present invention. FIG. 15 is a schematic circuit diagram of a semiconductor memory device according to a fourth embodiment of the invention. Unlike FIG. 11, FIG. 15 provides a wider perspective of the proposed semiconductor memory device. The illustrated memory device, however, is different from the device of FIG. 11 in that the cell arrays can be refreshed in partial refresh mode. Despite this difference, the two devices are similar in most part. More specifically, the cell arrays shown in FIG. 15 correspond to the cell arrays 11 shown in FIG. 11. Sense amplifiers in FIG. 15 correspond to the sense amplifiers 12 shown in FIG. 11. Shift register sets (SRS) in FIG. 15 correspond to the shift registers 19 shown in FIG. 11. Buffers (BUFF) in FIG. 15 correspond to the buffers 41 explained in FIG. 11. Control circuit blocks represented by the hatched rectangles in FIG. 15 include the RBLK latches 22, shift command generators 23, and control signal generators 24 shown in FIG. 11. RBLKEZ (indicated by the dotted arrows) in FIG. 15 are the row block selection signals RBLKEZx, RBLKEZa, and the like shown in FIG. 11 RBLKRZ in FIG. 15 corresponds to the refresh signal path that extends from each shift switch 21 to its preceding RBLK latch 22.

In addition to the components named above, the semiconductor memory device of FIG. 15 has the following elements: a partial refresh controller 71, a refresh cycle generator 72, a refresh array status latch 74, and inverters Z47 and Z48.

Cell arrays are blocks of memory cells arranged in matrix form, each block containing a predetermined number of rows (or word lines). Those cell arrays are divided into two large groups. In the example of FIG. 15, they are divided into the left group and right group.

The partial refresh controller 71 accepts a partial refresh request from external circuitry when the refresh process has returned to a predefined start point. Upon acceptance of such a partial refresh request, the partial refresh controller 71 sends a refresh area switching signal REFSW to the subordinate word line address generator 73. In a partial refresh process, the partial refresh controller 71 initiates individual refresh cycles at the intervals specified by the refresh cycle generator 72.

The refresh cycle generator 72 produces refresh timing signals for use in partial refresh processes. Specifically, the refresh cycle generator 72 determines partial refresh intervals by dividing a specified interval of the entire memory refresh according to the ratio of partial refresh area size to total memory size.

The inverters Z47 to Z48 detects transfer of a refresh signal from one group to the other (from the left group to the right group in FIG. 15) and notifies the refresh array status latch 74 of that event.

When the partial refresh controller 71 has sent a refresh area switching signal REFSW indicating partial refresh mode, the subordinate word line address generator 73 increments the subordinate word line address each time all main word lines are refreshed. The subordinate word line address generator 73 actually skips some subordinate word lines. This is because the active range of subordinate word line address is defined in its upper digits including the most significant bit, depending on the size of a memory space that needs refresh. In other words, the subordinate word line address generator 73 only varies this predefined upper portion of subordinate word line address, skipping some lowest bits.

The refresh array status latch 74 monitors refresh signals transferred across the groups. By so doing, the refresh array status latch 54 can recognize which group of cell arrays is currently refreshed, and based on this knowledge, it asserts either one of two refresh area signals REFLZ or REFRZ. More specifically, REFLZ is set to low and REFRZ is set to high when a refresh signal has been transferred from the left group to the right group in FIG. 15. REFLZ is set to high and REFRZ is set to low when a refresh signal has been transferred from the right group to the left group.

Figure 16:
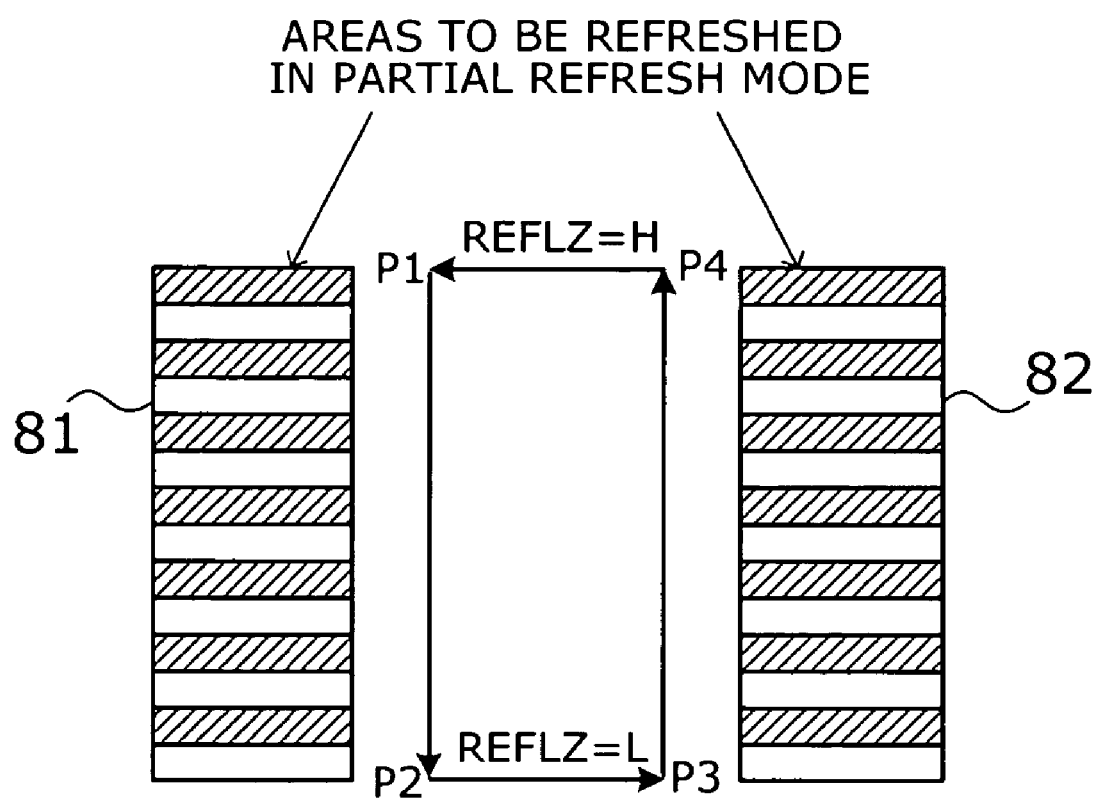
FIG. 16 shows the entry to and exit from partial refresh mode and explains how refresh loops are created.

FIG. 16 shows the entry to and exit from partial refresh mode and explains how refresh loops are created. The cell array group 81 shown on the left represents the cell arrays located on the left-hand side of FIG. 15. The other cell array group 82 represents the cell arrays located on the right-hand side of FIG. 12. The symbols P1 to P4 and associated arrows shown in FIG. 16 indicate in what order the cell array groups 81 and 82 are refreshed. The hatched sections of those cell array groups 81 and 82 represent the areas to be refreshed in partial refresh mode.

FIG. 17A gives a table showing the relationship between the refresh areas shown in FIG. 16 and refresh intervals. The symbol "CE2" in this table denotes an input signal that allows external circuitry to direct the memory device to operate in partial refresh mode. The memory device performs normal refresh over the entire memory area when CE2 is high. Setting CE2 to low enables partial refresh. The AREA SIZE field of the table indicates the ratio of partial refresh area to the entire cell array area. For example, the AREA SIZE value "½" shown in the third row of the table means that only half the total cell array area is refreshed in partial refresh mode.

The table of FIG. 17A represents the following scenario. When CE2 is asserted to low, the partial refresh controller 71 waits until the refresh area signal REFLZ becomes high. Upon detection of this REFLZ, the partial refresh controller 71 halves the refresh area, and the refresh cycle generator 72 doubles the refresh interval. As FIG. 16 shows, the refresh process always follows the same path P1-P2-P3-P4. The refresh intervals can be doubled simply because the refresh area is reduced to half. Afterwards, CE2 returns to high, and the memory device exits from partial refresh mode by resetting the refresh area to "×1" (i.e., entire area) and refresh interval to "×1" (i.e., normal interval).

FIG. 17B is a table showing an alternative control method that can be applied to the fourth embodiment. When CE2 is asserted to low, the partial refresh controller 71 enters to partial refresh mode immediately. In partial refresh mode, the partial refresh controller 71 keeps scanning address at normal refresh intervals, and if it encounters an address that is out of the predetermined partial refresh area, the controller 71 simply skips the refresh cycle of that address by masking a refresh start command. In this way the refresh area is substantively reduced. When CE2 returns to high, the memory device exits from partial refresh mode by resetting the refresh area to "×1" (i.e., entire area).

As can be seen from the above, the architecture of FIG. 15 requires no special steps when changing the refresh interval to exit from partial refresh mode. This is because the refresh process follows the same path P1-P2-P3-P4, whether it is in normal refresh mode or partial refresh mode. That is, the semiconductor memory device of FIG. 15 is advantageous over the device of FIG. 12 in terms of the simplicity of control in exiting from partial refresh mode.

The fourth embodiment of the present invention accomplishes partial refresh by repeating a refresh cycle for entire cell arrays while skipping some bits of subordinate word line address. This refresh mode limits the number of subordinate word lines to be refreshed, thus reducing the device's power consumption.

CONCLUSION

In conclusion, the present invention provides a semiconductor memory device with a shift register-based refresh address generation function. Shift registers provide each cell array with word line selection signals for use in refresh operation, under the control of dedicated shift register controllers. The shift register controllers are designed to activate a minimum number of shift registers that need to operate. This feature of the present invention reduces the amount of electrical current consumed in driving shift register control signals.

The foregoing is considered as illustrative only of the principles of the present invention. Further, since numerous modifications, changes will readily occur to those skilled in the art, it is not desired to limit the invention to the exact construction, applications shown, described, accordingly, all suitable modifications, equivalents may be regarded as falling within the scope of the invention in the appended claims, their equivalents.

What is claimed is:

1. A semiconductor memory device with a function of refreshing stored data, comprising:
    a plurality of cell arrays, each composed of a predetermined number of rows of memory cells;
    a plurality of sets of shift registers, an nth set of shift registers successively activating word line selection signals according to a given control signal, so as to refresh corresponding word lines of an nth cell array; and
    a plurality of shift register controllers, an nth shift register controller providing the control signal to the nth set of shift registers when the nth cell array is being refreshed, the nth shift register controller forwarding the control signal to an (n+1)th shift register controller when said refresh of the nth cell array is finished.

2. The semiconductor memory device according to claim 1, wherein the control signal that the nth shift register controller forwards to the (n+1)th set of shift registers is the word line selection signal used to refresh the last word line of the nth cell array.

3. The semiconductor memory device according to claim 1, wherein:
    the word lines are hierarchically composed of main word lines and subordinate word lines; and
    the nth shift register controller forwards the control signal to an (n+1)th shift register controller when refresh of all the subordinate word lines of the nth cell array is finished.

4. The semiconductor memory device according to claim 1, wherein:
    the word lines are hierarchically composed of main word lines and subordinate word lines; and
    subordinate word line address specifying which subordinate word line to refresh is advanced each time the main word lines of the nth cell array are all refreshed.

5. The semiconductor memory device according to claim 1, wherein:
    the plurality of cell arrays are divided into a plurality of groups of cell arrays; and
    the semiconductor memory device further comprises a partial refresh controller that controls refresh of a limited refresh area of the plurality of groups in partial refresh mode.

6. The semiconductor memory device according to claim 5, wherein:
    one of the plurality of cell arrays is designated as a refresh start point; and
    the partial refresh controller accepts a partial refresh request only when a refresh process has circulated among the cell arrays and returned to the refresh start point.

7. The semiconductor memory device according to claim 5, wherein, in the partial refresh mode, the partial refresh controller sets a refresh interval in inverse proportion to a ratio of the limited refresh area relative to an entire area of the cell arrays.

8. The semiconductor memory device according to claim 7, wherein the partial refresh controller exits from the partial refresh mode by expanding the refresh interval to the entire area of the cell arrays and then resetting the refresh interval to a normal interval.

9. The semiconductor memory device according to claim 4, wherein not all the subordinate word lines are selected in partial refresh mode.

10. The semiconductor memory device according to claim 1, wherein address selection of the cell arrays is locked by an external/internal address switching disable signal during a refresh process so that the cell arrays use internally generated address.

11. The semiconductor memory device according to claim 1, further comprising a plurality of redundancy circuits, one for each of the word lines, to repair a defect in the memory cells.

12. The semiconductor memory device according to claim 1, wherein data in said cell arrays are read out through shared sense amplifiers.

13. The semiconductor memory device according to claim 1, wherein the (n+1)th set of shift registers supplies the control signal to the nth shift register controller.

14. The semiconductor memory device according to claim 1, wherein the forwarded control signal is used to control the (n+1)th set of shift registers.

15. The semiconductor memory device according to claim 13, wherein the supplied control signal is used to stop an operation of the nth set of shift registers.

16. A semiconductor memory device with a function of refreshing stored data, comprising:
    a plurality of cell arrays, each composed of a predetermined number of rows of memory cells;
    a plurality of sets of shift registers, an nth set of shift registers successively activating word line selection signals according to given control signal, so as to refresh corresponding word lines of an nth cell array; and
    a plurality of shift register controllers, an nth shift register controller providing the control signal to the nth set of shift registers when the nth cell array is being refreshed, the nth shift register controller forwarding the control signal to an (n+1)th set of shift registers when said refresh of the nth cell array is finished.

17. The semiconductor memory device according to claim 16, wherein:
    the word lines are hierarchically composed of main word lines and subordinate word lines; and
    the nth shift register controller forwards the control signal to the (n+1)th set of shift registers when refresh of all the subordinate word lines of the nth cell array is finished.

* * * * *